(12) United States Patent
Sherrer et al.

(10) Patent No.: US 7,012,489 B2
(45) Date of Patent: Mar. 14, 2006

(54) COAXIAL WAVEGUIDE MICROSTRUCTURES AND METHODS OF FORMATION THEREOF

(75) Inventors: David W. Sherrer, Radford, VA (US); John J. Fisher, Blacksburg, VA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

(21) Appl. No.: 10/793,574

(22) Filed: Mar. 4, 2004

(65) Prior Publication Data

US 2004/0263290 A1      Dec. 30, 2004

Related U.S. Application Data

(60) Provisional application No. 60/452,073, filed on Mar. 4, 2003, provisional application No. 60/474,549, filed on May 29, 2003.

(51) Int. Cl.
*H01P 3/06* (2006.01)

(52) U.S. Cl. .......................................... 333/244; 29/828

(58) Field of Classification Search ............... 333/243, 333/244, 238; 174/117 AS; 29/828
See application file for complete search history.

(56) References Cited

U.S. PATENT DOCUMENTS

| | | | |
|---|---|---|---|
| 5,381,157 A | | 1/1995 | Shiga |
| 5,793,272 A | | 8/1998 | Burghartz et al. |
| 6,008,102 A | | 12/1999 | Alford et al. |
| 6,466,112 B1 | * | 10/2002 | Kwon et al. ................ 333/243 |
| 2003/0222738 A1 | | 12/2003 | Brown et al. |

FOREIGN PATENT DOCUMENTS

| | | | | |
|---|---|---|---|---|
| JP | 6085510 | * | 3/1994 | ................ 333/238 |
| WO | WO 00/07218 | | 2/2000 | |
| WO | WO 00/39854 | | 7/2000 | |
| WO | WO 02/080279 A1 | | 10/2002 | |

OTHER PUBLICATIONS

Elliott Brown/MEMGen Corporation; "RF Applications of EFAB Technology"; MTT-S IMS 2003; pp. 1-15.
Yoon et al., "3-D Lithography and Metal Surface Micromachining for RF and Microwave MEMS"; IEEE 2002, pp. 673-676.
Katehi et al., "MEMS and Si Micromachined Circuits for High-Frequency Applications", IEEE 2002, pp. 858-866.
Yoon et al., "Monolithic Integration of 3-D Electroplated Microstructures with Unlimited Number of Levels Using Planarization with a Sacrificial Metallic Mold (PSMM)"; IEEE Robotics and Automation Society, Orlando Florida, Jan. 1999, pp. 624-629.
Yoon et al., "CMOS-Compatible Surface Micromachined Suspended-Spiral Inductors for Multi-GHz Silicon RF ICs"; IEEE 2002; pp. 591-593.

(Continued)

*Primary Examiner*—Benny T. Lee
(74) *Attorney, Agent, or Firm*—Jonathan D. Baskin

(57) ABSTRACT

Provided are coaxial waveguide microstructures. The microstructures include a substrate and a coaxial waveguide disposed above the substrate. The coaxial waveguide includes: a center conductor; an outer conductor including one or more walls, spaced apart from and disposed around the center conductor; one or more dielectric support members for supporting the center conductor in contact with the center conductor and enclosed within the outer conductor; and a core volume between the center conductor and the outer conductor, wherein the core volume is under vacuum or in a gas state. Also provided are methods of forming coaxial waveguide microstructures by a sequential build process and hermetic packages which include a coaxial waveguide microstructure.

26 Claims, 18 Drawing Sheets

OTHER PUBLICATIONS

Yoon et al., "Multilevel Microstructure Fabrication Using Single-Step 3D Photolithography and Single-Step Electroplating"; SPIE vol. 3512 (Sep. 1998); pp. 358-366.

Lee et al., "Micromachining Applications of a High Resolution Ultrathick Photoresist"; J. Vac. Sci. Technol. B 13(6), Nov./Dec. 1995, pp. 3012-3016.

H. Guckel; "High-Aspect-Ratio Micromachining Via Deep X-Ray Lithography"; Proceedings of the IEEE, vol. 86, No. 8 (Aug. 1998); pp. 1586-1593.

Yoon et al., "Monolithic High-Q Overhang Inductors Fabricated on Silicon and Glass Substrates"; International Electron Devices Meeting; Washington D.C. (Dec. 1999) pp. 753-756.

Engelmann et al., "Fabrication of High Depth-to-Width Aspect Ratio Microstructures"; IEEE Micro Electro Mechanical Systems (Feb. 1992); pp. 93-98.

Frazier et al., "Metallic Microstructures Fabricated Using Photosensitive Polyimide Electroplating Molds"; Journal of Microelectromechanical Systems, vol. 2, No. 2, Jun. 1993, pp. 87-94.

Yoon et al, "High-Performance Three-Dimensional On-Chip Inductors Fabricated by Novel Micromachining Technology For RF MMIC"; IEEE (1999); pp. 1523-1526.

Loechel et al., "Application of Ultraviolet Depth Lithography for Surface Micromachining"; J. Vac. Sci. Technol. B 13(6), Nov./Dec. 1995; pp. 2934-2939.

Yoon et al., "High-Performance Electroplated Solenoid-Type Integrated Inductor ($SI^2$) for RF Applications Using Simple 3D Surface Micromachining Technology"IEEE 1998; pp. 544-547.

Chomnawang et al., "On-chip 3D Air Core Micro-Inductor for High-Frequency Applications Using Deformation of Sacrificial Polymer", Proc. SPIE vol. 4334, pp. 54-62, Mar. 2001.

* cited by examiner

FIG. 2
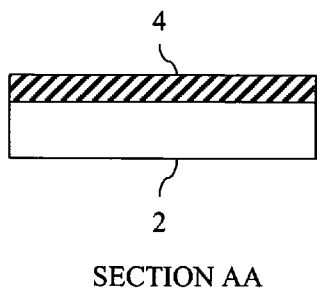
SECTION AA
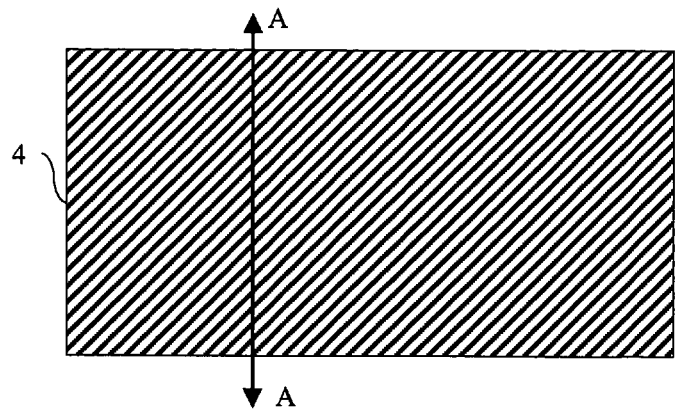
FIG. 3
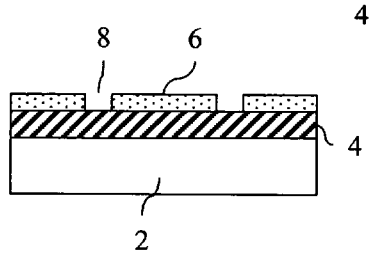
SECTION AA
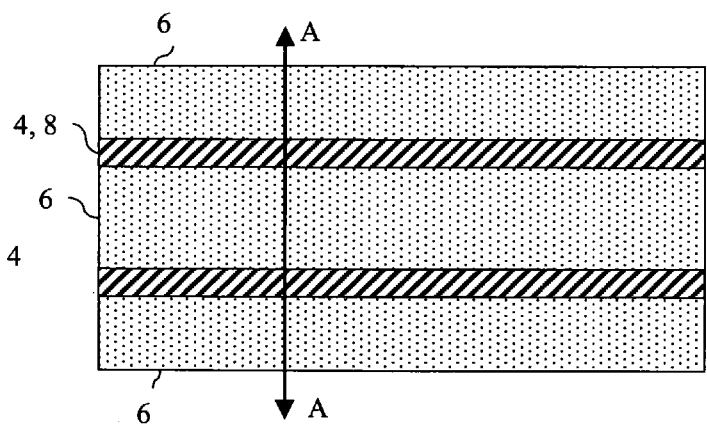
FIG. 4
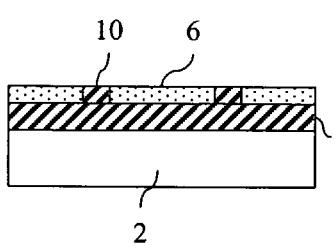
SECTION AA
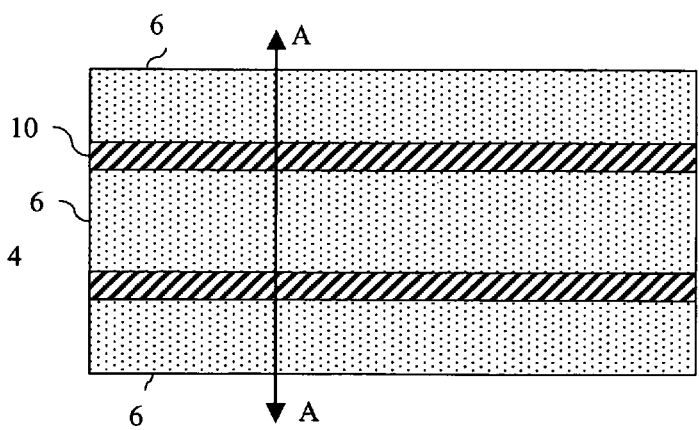

SECTION AA

SECTION AA

FIG. 14
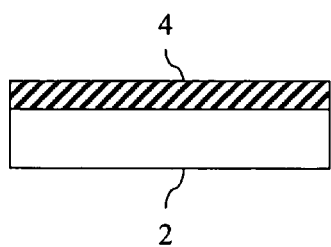
SECTION AA
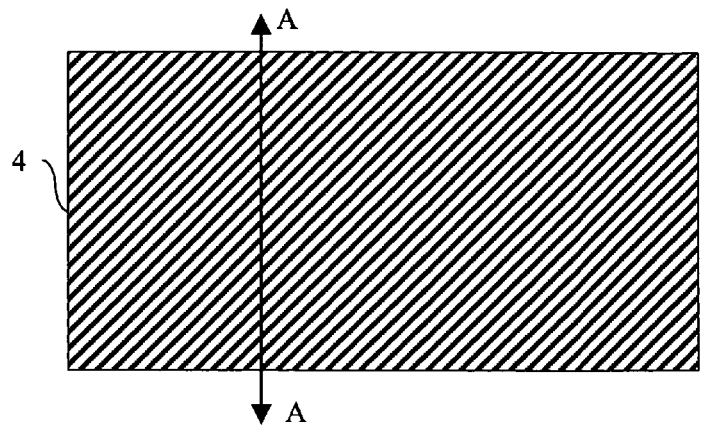
FIG. 15
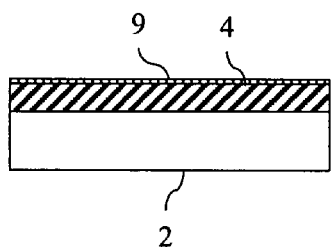
SECTION AA
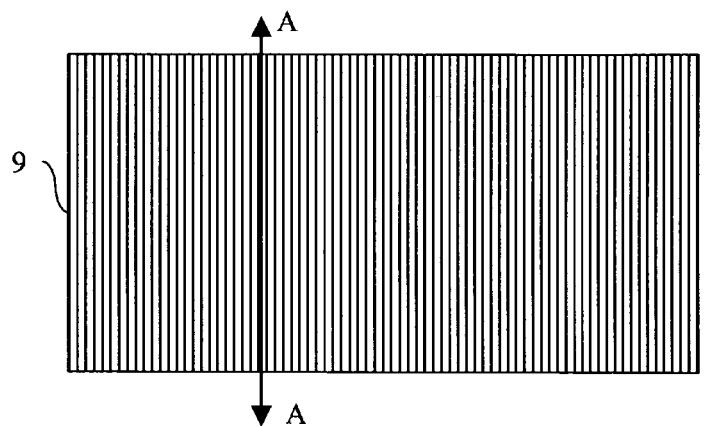
FIG. 16
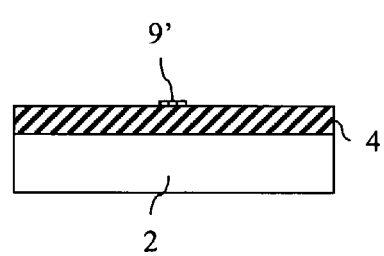
SECTION AA
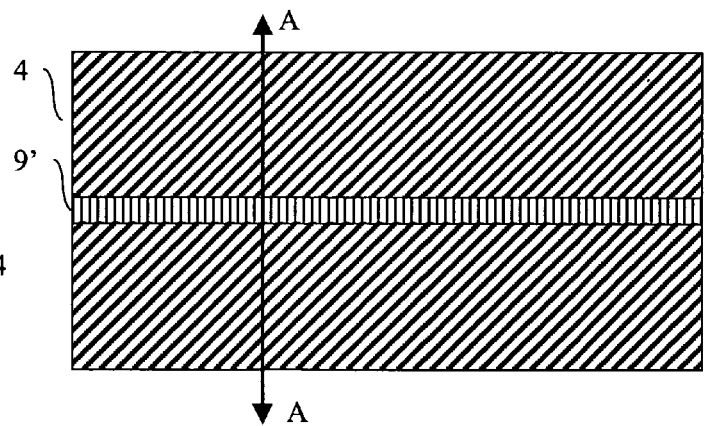

34

34

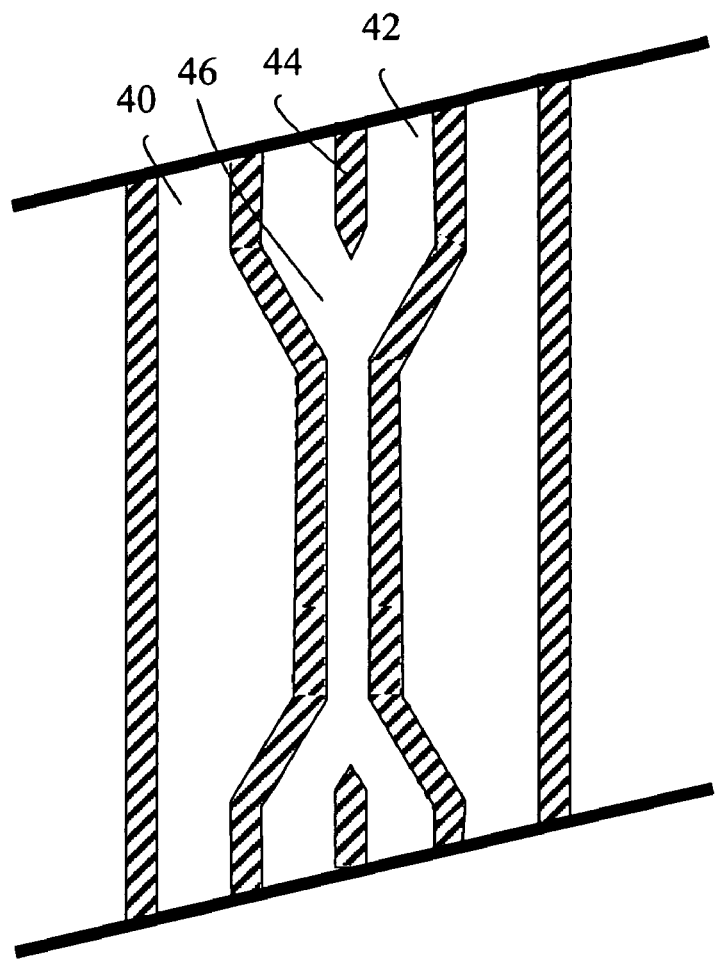
FIG. 32
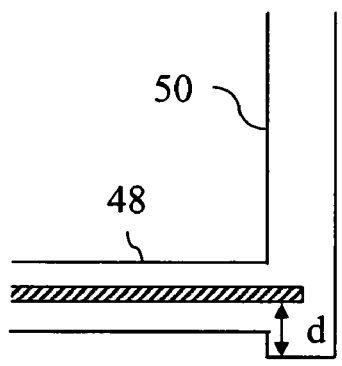 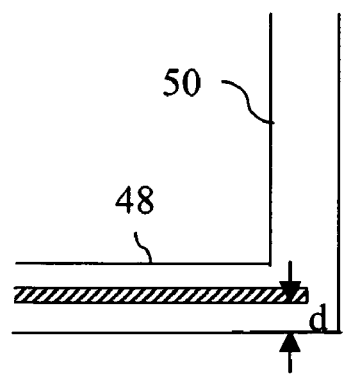
FIG. 33A  FIG. 33B

COAXIAL WAVEGUIDE MICROSTRUCTURES AND METHODS OF FORMATION THEREOF

CROSS-REFERENCE TO RELATED APPLICATIONS

This application claims the benefit of priority under 35 U.S.C. §119(e) to U.S. Provisional Application Nos. 60/452,073 filed Mar. 4, 2003, and 60/474,549 filed May 29, 2003, the entire contents of which applications are incorporated herein by reference.

GOVERNMENT INTEREST

This invention was made with Government support under Agreement No. W911QX-04-C-0097 awarded by DARPA. The Government has certain rights in the invention.

FIELD OF THE INVENTION

This invention relates generally to microfabrication technology and to electronic devices. More particularly, the present invention relates to coaxial waveguide microstructures and to methods of forming such microstructures, as well as to electronic devices which include such microstructures.

BACKGROUND OF THE INVENTION

Coaxial waveguide microstructures formed by sequential build processes have been described, for example, in International Application Publication No. WO 00/39854 (WO '854). With reference to FIG. 1A, WO '854 discloses a coaxial waveguide microstructure 100 formed by a sequential build process. The microstructure includes an insulating substrate 102, metallic ground lines 104 formed on the substrate 102 which are disconnected and divided into two parts, metallic supporters 106 formed on the surface of the insulating substrate between the divided ground lines 104, a signal line 108 on the supporters 106 for transmission of the signals, ground walls 110 formed on the ground lines, a ground line 112 formed on the ground walls 110 and an air or vacuous core volume. There are various disadvantages associated with this type of coaxial waveguide structure. For example, the use of metal supporters for supporting the signal line would result in some degree of reflection of the propagated waves and thus create signal interference. Further, the process is not readily scalable to a stacked structure having a plurality of coaxial layer structures due, for example, to the requirement that the metal supporters be connected to the dielectric substrate as a means of support. A multi-layer structure is desirable, for example, in cross-overs and for realizing a complex distribution network. In addition, the choice of a substrate material in this known structure is not flexible, but is limited to dielectric materials to achieve similar waveguiding performance. Further, the coaxial waveguide structure cannot be separated from the substrate due to the requisite mechanical connection of the supporters to the substrate.

FIG. 1B illustrates another coaxial waveguide microstructure disclosed in WO '854. The microstructure 114 includes a semiconductor substrate 116, first and second ground lines 118, 120, a dielectric supporter 122, and a signal line 124. Space 126 can be vacuous or air. The semiconductor has a groove, and the first ground line is fanned on the surface of the substrate and on the surface of the groove. In this way, the signal line is formed at almost an identical height as that of the surface of the semiconductor substrate, thus allowing easy connection to other connections formed on the semiconductor substrate. This structure, however, also has various disadvantages. For example, the process is not sealable to a multiple coaxial layer structure due to the requirement of a recessed substrate, the geometry of the waveguide structure, and the requirement for a groove on a planar substrate to achieve the requisite planarization. Finally is it not clear that the structure could be self-supporting and thus removed from the substrate, which would be useful, for example, in a stacked coaxial network.

There is thus a need for improved methods of forming coaxial waveguide microstructures which overcome or conspicuously ameliorate one or more of the problems described above with respect to the related art.

SUMMARY OF THE INVENTION

In accordance with a first aspect of the invention, provided are coaxial waveguide microstructures. The microstructures include a substrate and a coaxial waveguide disposed above the substrate. The coaxial waveguide includes: a center conductor; an outer conductor including one or more walls, spaced apart from and disposed around the center conductor; one or more dielectric support members for supporting the center conductor in contact with the center conductor and enclosed within the outer conductor; and a core volume between the center conductor and the outer conductor, wherein the core volume is under vacuum or in a gas state.

In accordance with a further aspect of the invention, provided are methods of forming coaxial waveguide microstructures by a sequential build process. The methods involve: (a) depositing a plurality of layers over a substrate, wherein the layers include one or more of a metal material, a sacrificial photoresist material, and a dielectric material, thereby forming a structure above the substrate, which includes: a center conductor; an outer conductor having one or more walls, spaced apart from and disposed around the center conductor; one or more dielectric support members for supporting the center conductor, in contact with the center conductor and enclosed within the outer conductor; and a core volume between the center conductor and the outer conductor, wherein the core volume includes sacrificial photoresist; and (b) removing the sacrificial photoresist from the core volume.

Other features and advantages of the present invention will become apparent to one skilled in the art upon review of the following description, claims, and drawings appended hereto.

BRIEF DESCRIPTION OF THE DRAWINGS

The present invention will be discussed with reference to the following drawings, in which like reference numerals denote like features, and in which:

FIGS. 2–13 illustrate cross-sectional and top-down views of a first exemplary coaxial waveguide microstructure during various stages of formation in accordance with the invention;

FIGS. 14–26 illustrate cross-sectional and top-down views of a second exemplary coaxial waveguide microstructure during various stages of formation in accordance with the invention;

FIG. 32 illustrates two waveguides in the form of a signal or power coupler, in accordance with the invention;

FIGS. 33A and 33B illustrate exemplary structures for transitioning between coaxial and non-coaxial waveguide microstructures, in accordance with the invention;

DETAILED DESCRIPTION OF THE INVENTION

Figure 1A:
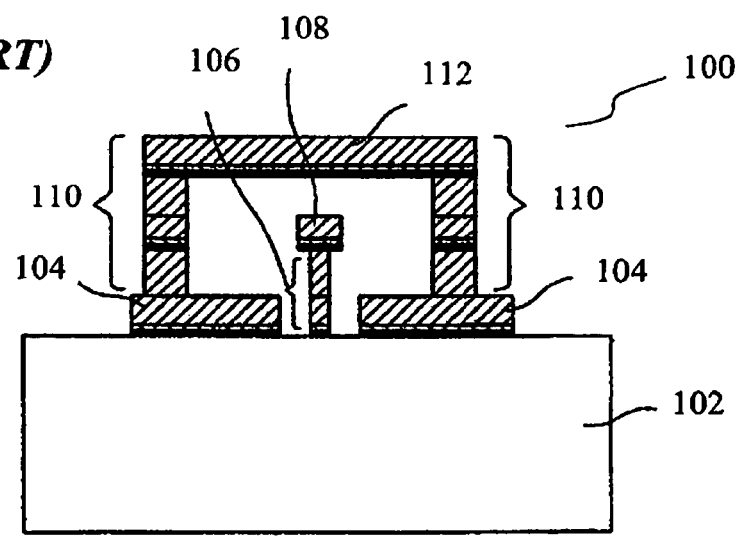
FIGS. 1A and 1B illustrate cross-sectional views of known coaxial waveguide microstructures.
Figure 1B:
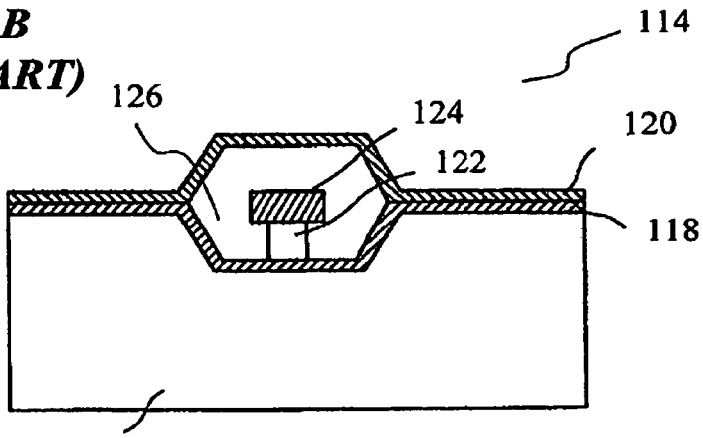

The exemplary processes to be described involve a sequential build to create microstructures containing metal, dielectric and gas or a vacuous atmosphere. In the sequential build process, a structure is formed by sequentially layering various materials in a defined manner. When implemented with lithographic patterning and other optional processes, for example, planarization techniques, a flexible method to form a variety of components, such as the exemplified suspended coaxial waveguide microstructures, is provided.

The sequential build process is generally accomplished through processes including one or more of: (a) metal coating, sacrificial photoresist coating, and dielectric coating processes; (b) surface planarization; (c) photolithography; and (d) etching or other layer removal processes. In depositing metal, plating techniques have been found to be particularly useful, although other metal deposition techniques such as physical vapor deposition (PVD) and chemical vapor deposition (CVD) techniques may be used. A typical sequential build process which includes a plating technique is described as follows.

An optionally patterned, conductive base or seed layer is formed at all locations to be plated with metal. Patterning can be accomplished, for example, by selective deposition of the conductive base or seed layer, such as by shadow masking, etching the seed layer using a resist and etchant, or by applying thin passivation to the seed layer such as a thin permanent dielectric, such methods being known in the art of plating on seed layers. A photoresist pattern, or mold, is formed over the base or seed layer by coating and patterning. Next, a metal structure is plated on all areas at which the base layer or seed layer is exposed until a desired thickness is achieved. The resulting structure is optionally planarized to eliminate significant thickness variations from being carried into subsequent iterations of the process sequence.

One or more dielectric layers may be deposited at a desired point in the process sequence. For example, a dielectric layer may be formed prior to seed layer formation if metal plating over exposed dielectric material in a subsequent plating step is desired, or after seed layer formation if plating over the exposed dielectric material is to be prevented. The dielectric layer may, for example, be formed by spin coating and patterning of the dielectric. This technique is useful, for example, where the patterned layer does not adversely affect a resist layer formed thereon, for example, where the thickness of the patterned dielectric (e.g., several microns) is significantly less than a resist (e.g., 100 $\mu$m) formed thereon. Another technique for forming the dielectric features involves pre-patterning the plating base or seed layer in such a way that metal is not formed on certain regions of the base layer after formation of the resist pattern/mold, but rather leaves empty pockets which can subsequently be filled with the dielectric material. In this case, the dielectric material is typically filled to the level of the resist mold or above the resist mold, and is planarized with the resist and any metal to create a planar layer before the next process sequence begins.

After all of the structural layers have been created, the sacrificial resist is removed from the structure, leaving the other materials including the dielectric in place. This may be accomplished by use of a solvent or developer in which the resist is soluble and the other materials are insoluble or relatively insoluble. Optional finishing steps such as chemical polishing and/or overcoat plating may be desired.

The methods and devices of the invention will now be described with reference to FIGS. 2–13, which show cross-sectional and top-down views of an exemplary coaxial waveguide microstructure during various stages of formation in accordance with one aspect of the invention. The coaxial waveguides are useful for propagation of radio-frequency (RF) energy, for example, from several MHz to 100 GHz or more such as millimeter waves and microwaves, as well as DC signals.

Referring to FIG. 2, the waveguide is formed on a substrate 2 which may be, for example, a ceramic, a semiconductor, a metal, or a polymer. The substrate can take the form, for example, of a printed wiring board or a semiconductor substrate, such as a silicon or gallium arsenide wafer. The substrate may have an expansion coefficient similar to the materials used in forming the waveguide, and should be selected so as to maintain its integrity during formation of the waveguide. Also, the surface of the substrate 2 on which the waveguide is to be formed is typically planar. The substrate surface may, for example, be lapped and/or polished to achieve a high degree of planarity. Planarization of the surface of the structure being formed can be performed before or after formation of any of the layers during the process. Conventional planarization techniques, for example, chemical-mechanical-polishing (CMP), lapping, or a combination of these methods are typically used. Other known planarization techniques, for example, mechanical finishing such as mechanical machining, diamond turning, plasma etching, laser ablation, and the like, may additionally or alternatively be used.

A base layer 4 is deposited over the substrate 2 and forms a bottom wall of the waveguide outer conductor in the final waveguide structure. The base layer 4 may be formed of a material having high conductivity, such as a metal or metal-alloy (collectively referred to as "metal"), for example copper, nickel, aluminum, chromium, gold, titanium, alloys thereof, a doped semiconductor material, or combinations thereof, for example, multiple layers of such materials. The base layer 4 is deposited by a conventional process, for example, by plating such as electrolytic and/or electroless plating, physical vapor deposition (PVD) such as sputtering, or chemical vapor deposition (CVD). Plated copper is believed to be particularly suitable as the base layer material, with such techniques being well understood in the art. The plating can be, for example, an electroless process using a copper salt and a reducing agent. Suitable materials are commercially available and include, for example, CIRCUPOSIT™ electroless copper, available from Rohm and Haas Electronic Materials, L.L.C., Marlborough, Mass. Alternatively, the material can be plated by use of an electrically conductive seed layer followed by electrolytic plating. Suitable electrolytic materials are commercially available and include, for example, COPPER GLEAM™ acid plating products, available from Rohm and Haas Electronic Materials, L.L.C. The use of an activated catalyst followed by electrolytic deposition can alternatively be used. The base layer (and subsequent layers) may be patterned into arbitrary geometries to realize a desired device structure through the methods outlined.

The thickness of the base layer (and the subsequently formed other walls of the waveguide outer conductor) is selected to provide mechanical stability to the waveguide and to provide sufficient conductivity for the electrons moving through the waveguide. At very high frequencies, structural and thermal conductivity influences become more pronounced, as the skin depth will typically be less than 1 µm. The thickness thus will depend, for example, on the specific base layer material, the particular frequency to be propagated, and the intended application. For example, in instances in which the final structure is to be removed from the substrate, it may be beneficial to employ a relatively thick base layer, for example, from about 20 to 150 µm or from 20 to 80 µm, for structural integrity. Where the final structure is to remain intact with the substrate, it may be desired to employ a relatively thin base layer which may be determined by the skin depth requirements of the frequencies used. The base layer 4 may optionally next be planarized by the techniques described above.

With reference to FIG. 3, a photoresist layer 6 is deposited over the base layer 4, and is exposed and developed to form a pattern 8 for subsequent deposition of lower sidewall portions of the waveguide outer conductor. The pattern 8 includes two parallel channels in the resist, exposing the top surface of the base layer 4. Conventional photolithography steps and materials can be used for this purpose. The resist can be, for example, a positive or negative resist, such as Shipley BPR™-100, PHOTOPOSIT™ SP or PHOTOPOSIT™ SN, available from Rohm and Haas Electronic Materials, L.L.C., or a dry film, such as the LAMINAR™ dry films, also available from Rohm and Haas Electronic Materials, L.L.C.

As shown in FIG. 4, lower sidewall portions 10 of the waveguide outer conductor are next formed. Appropriate materials and techniques for forming the sidewalls are the same as those mentioned above with respect to the base layer. The sidewalls are typically formed of the same material used in forming the base layer 4, although different materials may be employed. In the case of a plating process, the application of a seed layer or plating base may be omitted as here when metal in a subsequent step will only be applied directly over a previously formed, exposed metal region. It should be clear, however, that the exemplified structures shown in the figures typically make up only a small area of a particular device, and metallization of these and other structures may be started on any layer in the process sequence, in which case seed layers are typically used.

Surface planarization at this stage can be performed in order to remove any unwanted metal deposited on the top surface of the resist in addition to providing a flat surface for subsequent processing. Through surface planarization, the total thickness of a given layer can be controlled more tightly than might otherwise be achieved through coating alone. For example, a CMP process can be used to planarize the metal and the resist to the same level. This may be followed, for example, by a lapping process, which slowly removes metal, resist, and any dielectric at the same rate, allowing for greater control of the final thickness of the layer.

Figure 5:
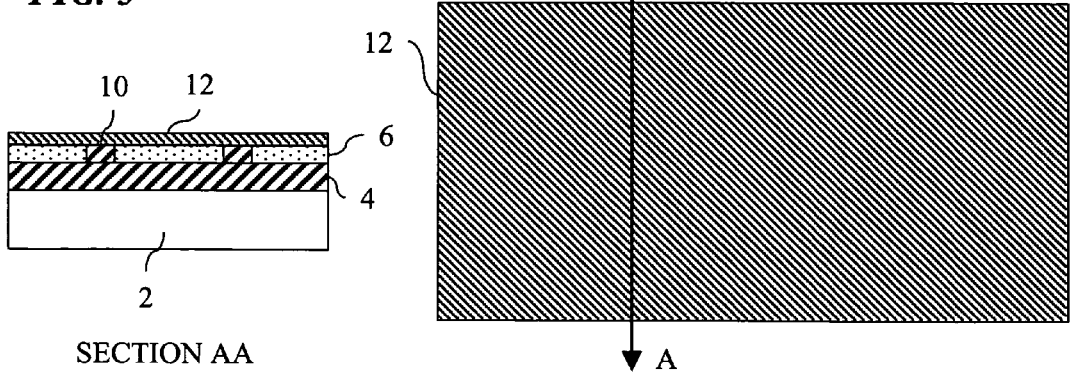

As shown in FIG. 5, a support layer 12 of a dielectric material is next deposited over the resist layer 6 and the lower sidewall portions 10. In subsequent processing, support structures are patterned from the support layer 12 to support the waveguide center conductor to be formed. As these support structures will lie in the core region of the final waveguide structure, the support layer 12 should be formed from a material such that the support structures do not create excessive losses for the energy to be transmitted through the waveguide. The material should also be capable of providing the mechanical strength necessary to support the center conductor and should be relatively insoluble in the solvent used to remove the sacrificial resist from the final waveguide structure. The support layer 12 material is typically a dielectric material selected from: inorganic materials, such as silicas and silicon oxides, SOL gels, various glasses, silicon nitride ($Si_3N_4$), aluminum oxides such as alumina ($Al_2O_3$), aluminum nitride (AlN), and magnesium oxide (MgO); organic materials such as polyethylene, polyester, polycarbonate, cellulose acetate, polypropylene, polyvinyl chloride, polyvinylidene chloride, polystyrene, polyamide, and polyimide; organic-inorganic hybrid materials such as organic silsesquioxane materials; a photodefinable dielectric such as a negative acting photoresist or photoepoxy which is not attacked by the sacrificial resist removal process to be conducted. It is advantageous to use materials which can be easily deposited, for example, by spin-coating, roller coating, squeegee coating, spray coating, chemical vapor deposition (CVD), or lamination. The support layer 12 is deposited to a thickness that provides for the requisite support of the center conductor without cracking or breakage. In addition, the thickness should not severely impact subsequent application of resist layers from the standpoint of planarity.

Figure 6:
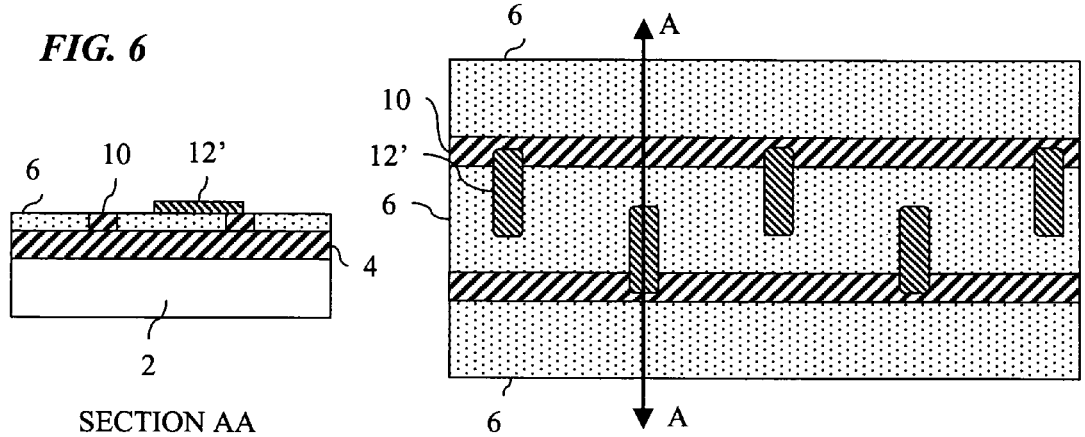

Referring to FIG. 6, the support layer is next patterned using standard photolithography and etching techniques to provide a plurality of conductor supports 12'. Plural conductor supports 12' may be associated with both of the lower sidewall portions 10. One end of each of the supports 12' is formed over one or the other lower sidewall portion 10 and the opposite end extends to a position over the resist layer 6 between the sidewall portions 10. The supports 12' on each sidewall portion are spaced apart from one another, typically at a fixed distance, and those on one sidewall portion are typically offset from those on the opposite sidewall portion so as not to be directly opposite one another. In an alternative embodiment, the support members 12' can be formed to extend from one sidewall portion 10 to the other. The number, shape, and pattern of arrangement of the supports 12' should be sufficient to provide support to the center conductor while preventing excessive signal loss. In addition, the shape and periodicity or aperiodicity may be selected to prevent reflections at frequencies where low loss propagation is desired, as can be calculated using methods know in the art of creating Bragg gratings and filters, unless such function is desired.

Figure 7:
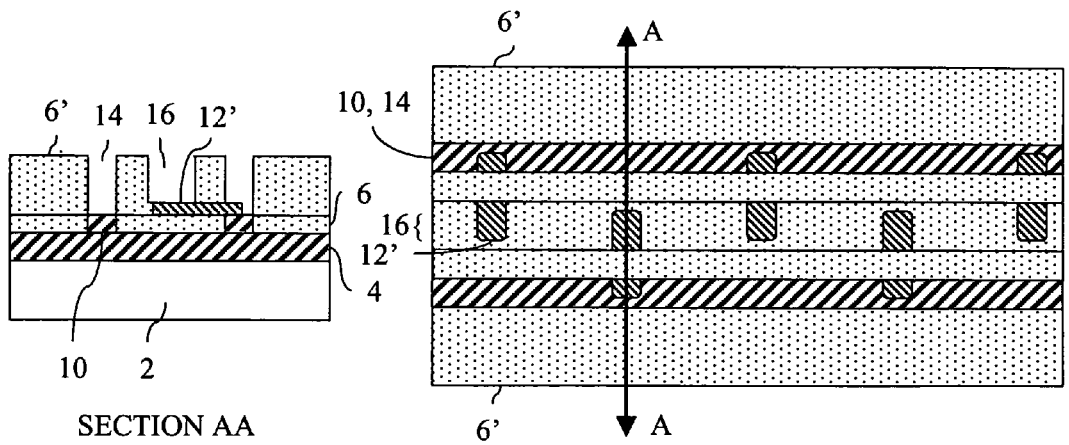

With reference to FIG. 7, a resist layer 6' is deposited over the substrate, and is exposed and developed to form patterns 14 and 16 for subsequent deposition of middle sidewall portions of the waveguide outer conductor and the center conductor, respectively. The pattern 14 for the middle sidewall portion includes two channels coextensive with the two lower sidewall portions 10. The lower sidewall portions 10 and the end of the conductor supports 12' overlying the lower sidewall portions are exposed by pattern 14. The pattern 16 for the center conductor is a channel parallel to and between the two middle sidewall patterns, exposing the opposite ends of and supporting portions of the conductor supports 12'. Conventional photolithography steps and materials, such as those described above, can be used for this purpose.

Figure 8:
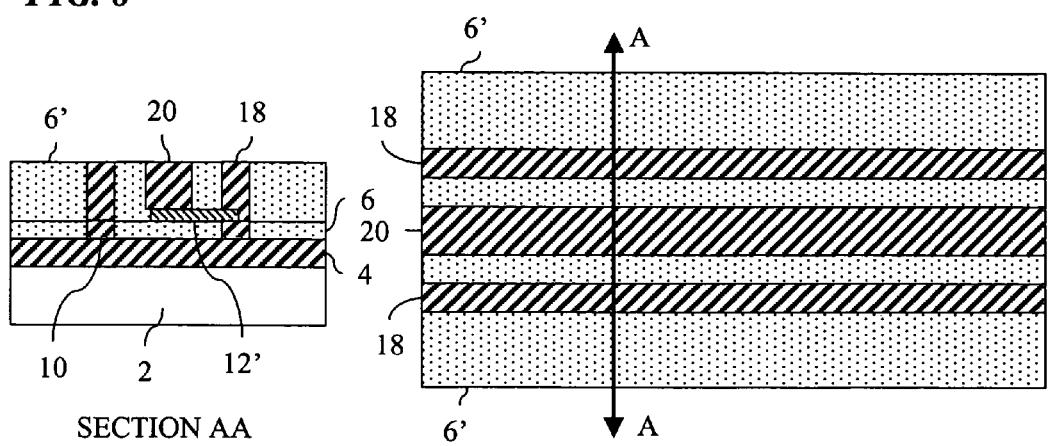

As shown in FIG. 8, the middle sidewall portions 18 of the outer conductor and the center conductor 20 are next formed by depositing a suitable material into the channels formed by the resist 6'. Appropriate materials and techniques for forming the middle sidewall portions 18 and center conductor 20 are the same as those mentioned above with respect to the base layer 4 and lower sidewall portions 10, although different materials and/or techniques may be employed. Surface planarization may optionally be performed at this stage to remove any unwanted metal deposited on the top surface of the resist in addition to providing a flat surface for subsequent processing, as has been previously described and optionally applied to any or every layer.

Figure 9:
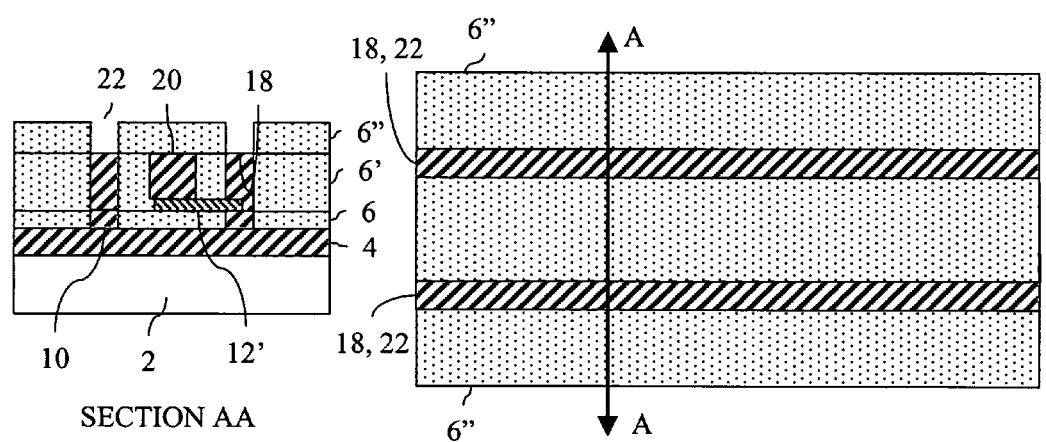

With reference to FIG. 9, a resist layer 6" is deposited over the substrate, and is exposed and developed to form pattern 22 for subsequent deposition of upper sidewall portions of the outer conductor. The pattern 22 for the middle sidewall portion includes two channels coextensive with and exposing the two middle sidewall portions 18. Conventional photolithography steps and materials as described above can be used for this purpose.

Figure 10:
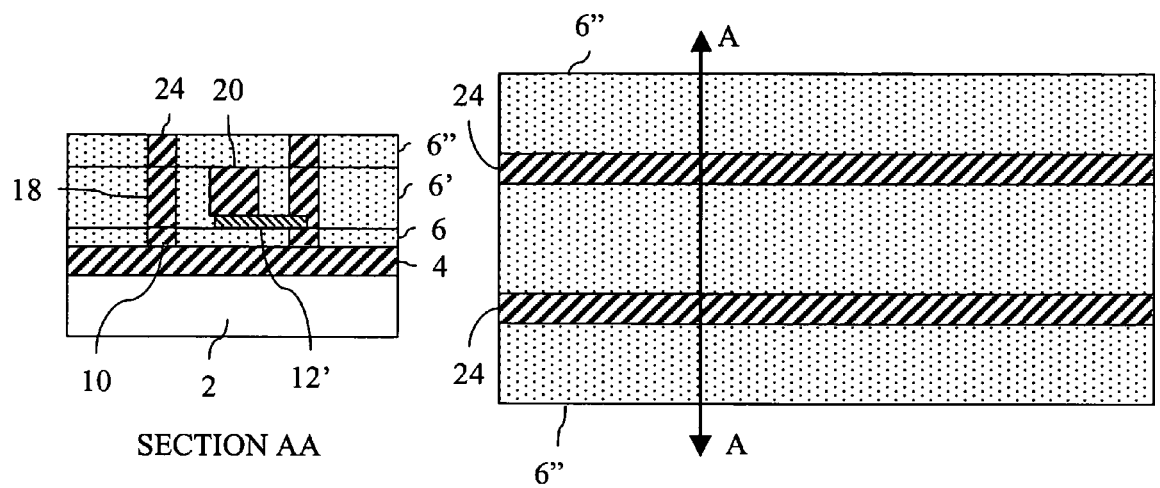

As illustrated in FIG. 10, upper sidewall portions 24 of the outer conductor are next formed by depositing a suitable material into the channels formed by the resist 6". Appropriate materials and techniques for forming the upper sidewalls are the same as those mentioned above with respect to the base layer and other sidewall portions. The upper sidewalls 24 are typically formed with the same materials and techniques used in forming the base layer and other sidewalls, although different materials and/or techniques may be employed. Surface planarization can optionally be performed at this stage to remove any unwanted metal deposited on the top surface of the resist in addition to providing a flat surface for subsequent processing.

Figure 11:
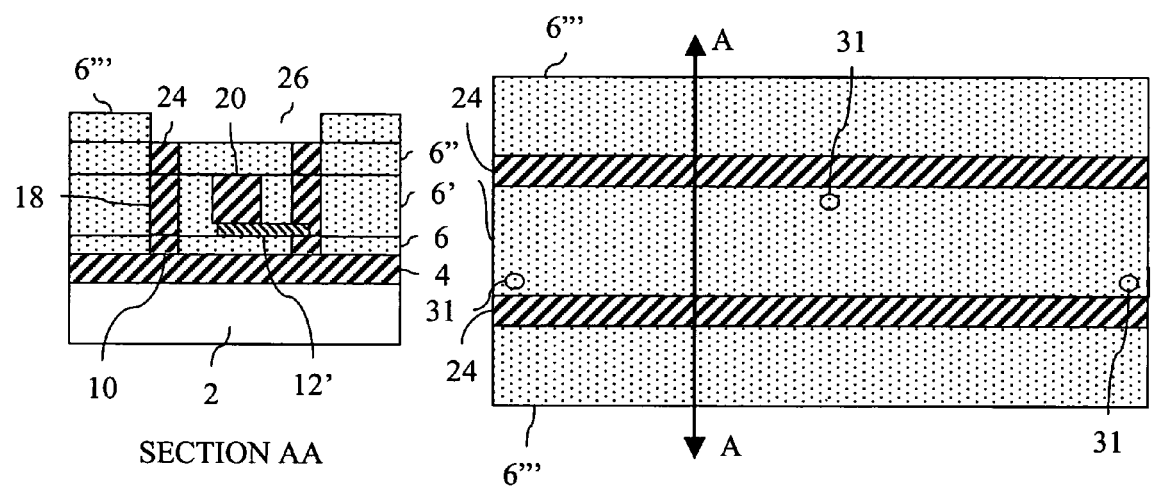

With reference to FIG. 11, a resist layer 6''' is deposited over the substrate, and is exposed and developed to form pattern 26 for subsequent deposition of the top wall of the waveguide outer conductor. The pattern 26 for the top wall exposes the upper sidewalls 24 and the area therebetween. Optionally, patterning of resist layer 6''' will also result in one or more regions of the resist layer 6''' in the area between upper sidewall portions 24. These remaining portions can, for example, be in the form of resist pillars 31. Subsequent deposition of the top wall of the outer conductor would be prevented in these regions of remaining resist 6'''. As described in greater detail below, this results in openings in the subsequently deposited outer conductor top wall facilitating removal of resist from the final structure.

Figure 12:
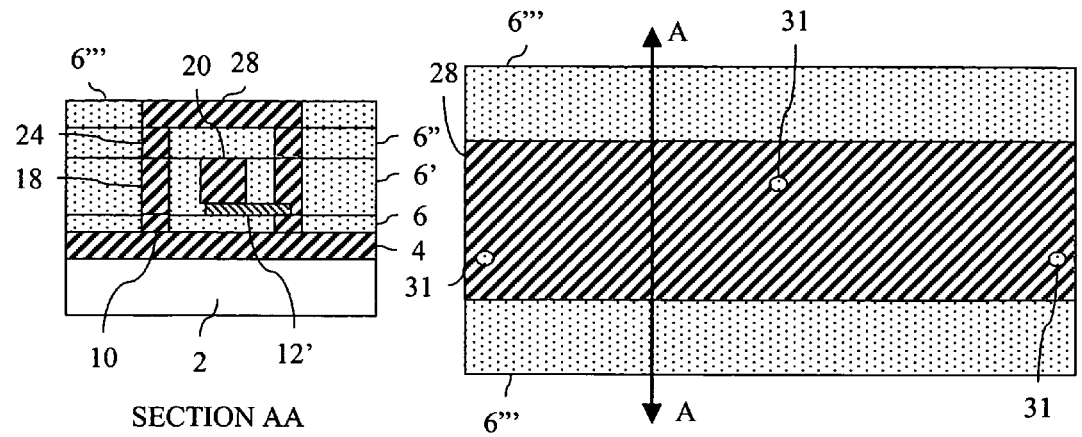

As shown in FIG. 12, the top wall 28 of the outer conductor is next formed by depositing a suitable material into the exposed region over and between the upper sidewall portion 24. As can be seen, deposition is prevented in the volume occupied by and on the resist pillars 31. Appropriate materials and techniques for forming the upper sidewalls are the same as those mentioned above with respect to the base layer and sidewall portions. The top wall 28 is typically formed with the same materials and techniques used in forming the base layer and other sidewalls, although different materials and/or techniques may be employed. Surface planarization can optionally be performed at this stage.

With the basic structure of the waveguide being complete, additional layer may be added or the resist remaining in the structure may next be removed. The resist may be removed by known solvents or removers based on the type of resist used. In order for the resist to be removed from the structure, the solvent must come into contact with the resist. The resist is exposed at the end faces of the waveguide structure. Additional openings in the waveguide such as described above with respect to FIGS. 11–12 may be provided to facilitate contact between the solvent and resist throughout the structure. Other structures for allowing contact between the resist and solvent are envisioned. For example, openings can be formed in the waveguide sidewalls during the patterning process. The dimensions of these openings may be selected to minimize interference with, scattering or leakage of the guided wave. The dimensions can, for example, be selected to be less than $\frac{1}{8}$ or $\frac{1}{10}$ of the wavelength of the highest frequency used.

Figure 13:
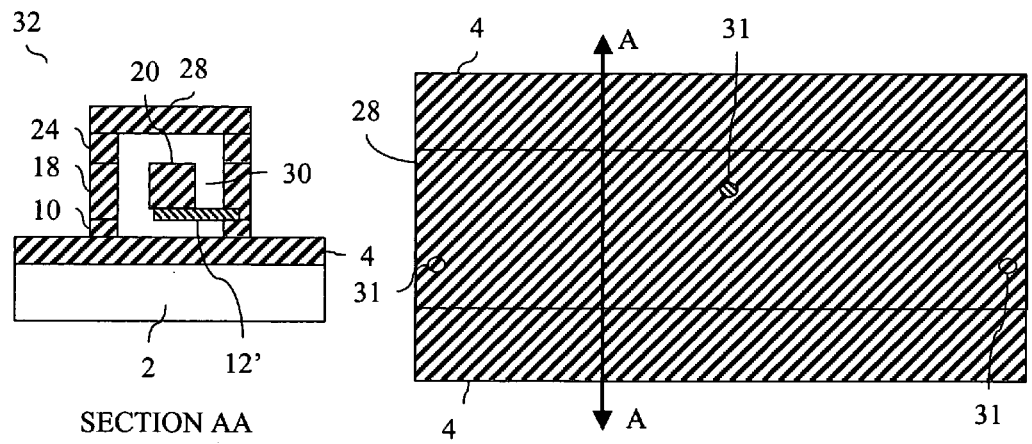

The final waveguide structure 32 after removal of the sacrificial resist is shown in FIG. 13. The space previously occupied by the sacrificial resist within the outer walls of the waveguide forms the waveguide core 30. This volume is typically occupied by air. However, it is also envisioned that a gas having better dielectric properties than air may be used in the core or a vacuum can be created in the core, for example, when the structure forms part of a hermetic package. As a result, a reduction in absorption from water vapor that would otherwise adsorb to the surfaces of the waveguides can be realized.

It should be noted that the coaxial waveguide microstructures described above are exemplary, and other structures are envisioned. For example, FIGS. 14–26 illustrate a further exemplary waveguide structure which employs a different center conductor support structure. The description above with respect to FIGS. 2–13 is generally applicable to this embodiment with differences being outlined below.

As shown in FIG. 15, the conductor support members are formed by depositing a passivation layer 9 over the base layer 4. The passivation layer is a material upon which the conductive material making up the waveguide walls and conductor does not deposit. Suitable materials for the passivation layer include, for example, a photodefinable dielectric such as a negative acting photoresist or photoepoxy which is not attacked by the sacrificial resist removal process to be conducted. The passivation layer may alternatively be also be a thinner version of the structural dielectric that is used to fill the gaps in subsequent step. The passivation layer can be formed by known methods such as spin-coating, roller coating, or vapor deposition.

The passivation layer 9 is next patterned using standard photolithography (for photodefinable composition) or photolithography and etching techniques to form passivation layer 9' on which the center conductor supports are to be formed, as illustrated in FIG. 16.

Figure 17:
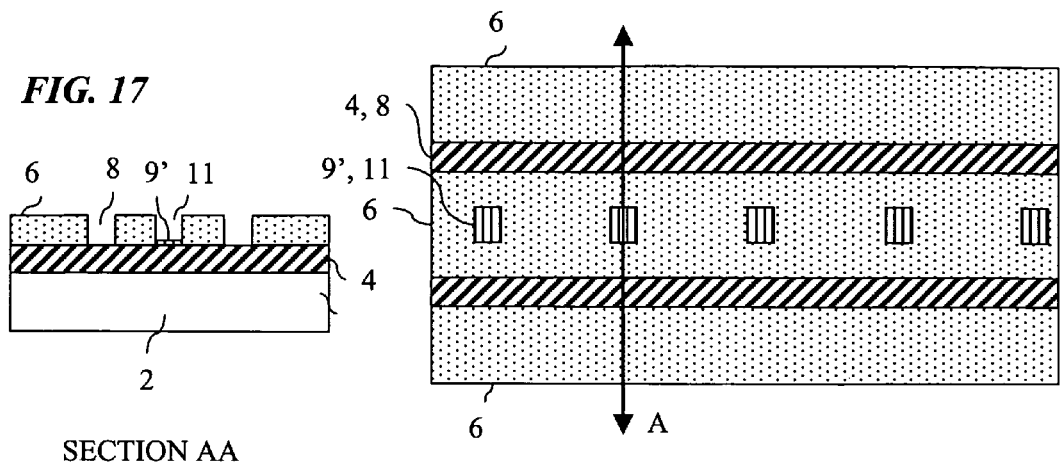
Figure 18:
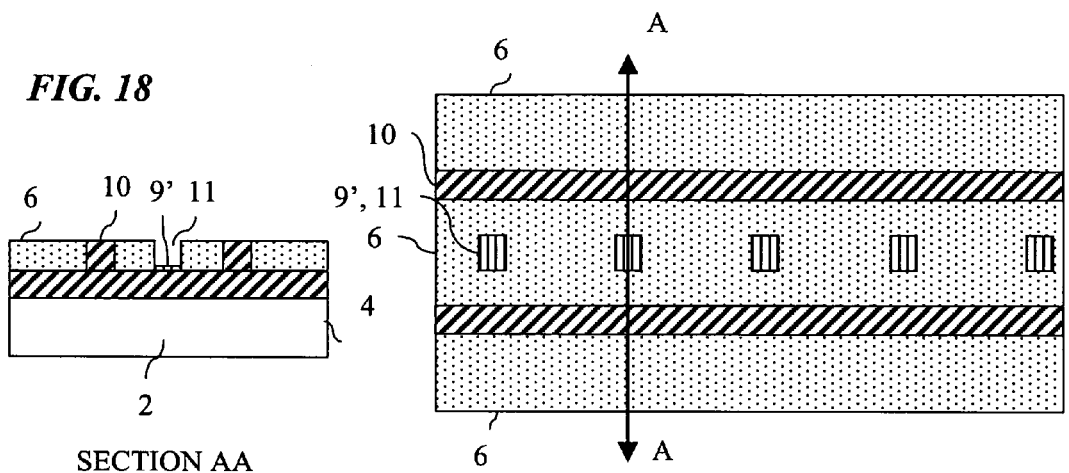

With reference to FIG. 17, a photoresist layer 6 is deposited over the base layer 4 and passivation layer 9', and is exposed and developed to form parallel channels 8 for subsequent deposition of lower sidewall portions of the waveguide as described above, and windows 11 over the passivation layer 9' where the conductor supports are to be formed. As shown in FIG. 18, the lower sidewall portions 10 of the waveguide are next formed as described above.

Figure 19:
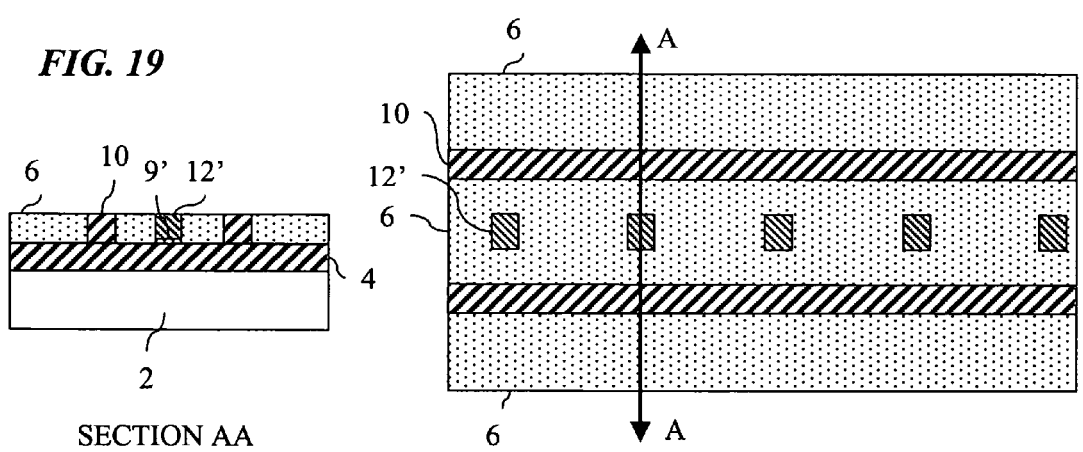

A dielectric material is next deposited over the substrate surface. The dielectric material may be any of those described above with reference to the support structures of the first exemplary waveguide microstructure. The material can be blanket-deposited across the entire surface of the substrate followed by a planarization, for example, by CMP, such that the dielectric material 12' fills the windows over the exposed passivation material 9' and is limited to those areas, as illustrated in FIG. 19. The dielectric material can alternatively be selectively deposited in those areas by known techniques, for example, by spin coating, screen printing, resist plating, or vapor deposition.

Figure 20:
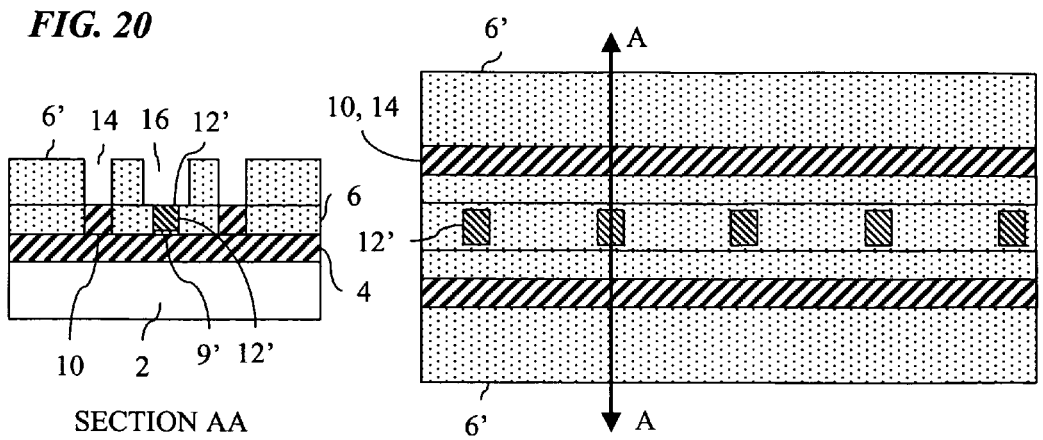

With reference to FIG. 20, after deposition of a seed layer as a plating base, a resist layer 6' is deposited over the substrate, and is exposed and developed to form patterns 14 and 16 for subsequent deposition of middle sidewall portions of the waveguide and the center conductor, respectively, as described above.

Figure 21:
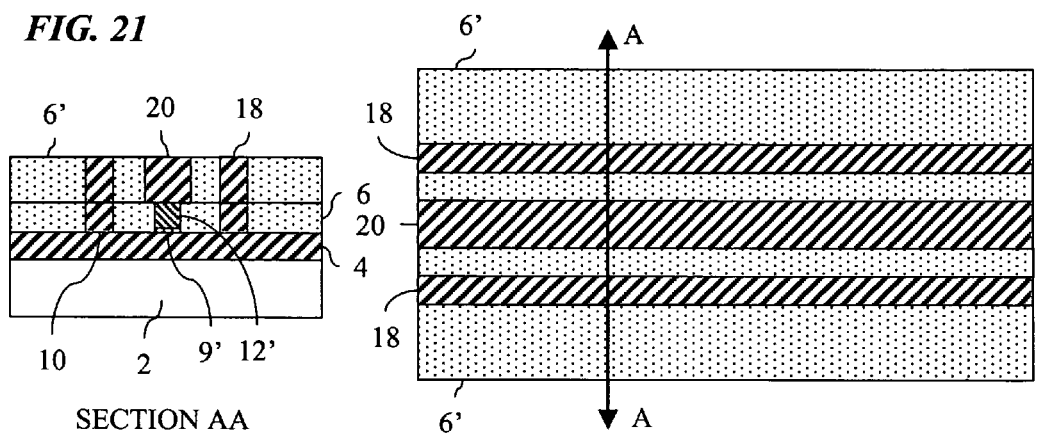
Figure 22:
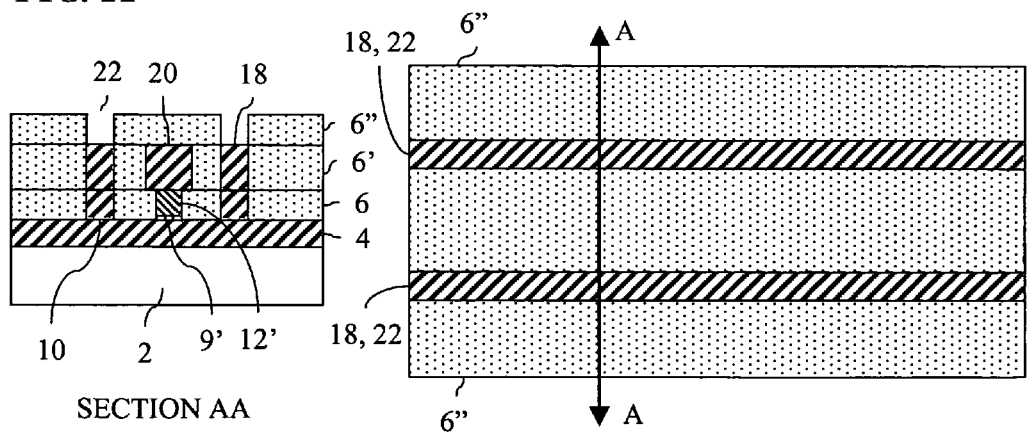
Figure 23:
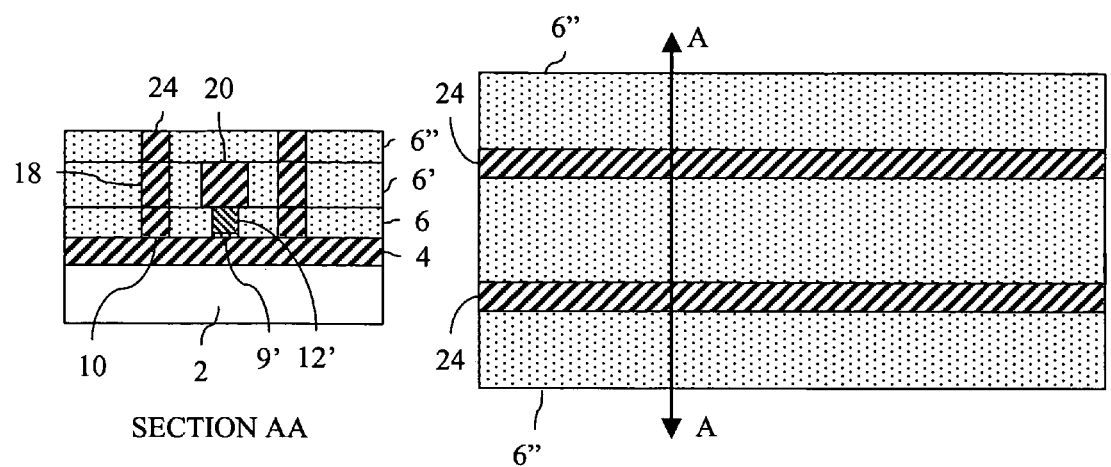
Figure 24:
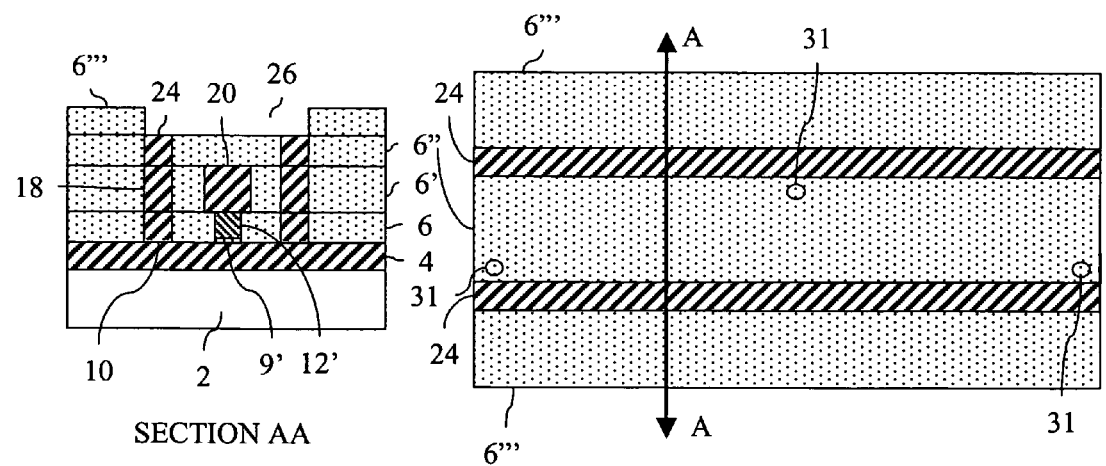

The middle sidewall portions 18 and center conductor 20 of the waveguide are next formed by depositing a suitable material into the channels formed by the resist, as illustrated in FIG. 21. As shown, the center conductor 20 is formed on the conductor supports 12'. As shown in FIGS. 22–26, the waveguide structure is completed as described above with respect to the previous exemplary embodiment.

For certain applications, it may be beneficial to remove the final waveguide structure from the substrate to which it is attached. This would allow for coupling on both sides of the released interconnect network to another substrate, for example, a gallium arsenide die such as a monolithic microwave integrated circuit or other devices. Release of the structure from the substrate may be accomplished by various techniques, for example, by use of a sacrificial layer between the substrate and the base layer which can be removed upon completion of the structure in a suitable solvent. Suitable materials for the sacrificial layer include, for example, photoresists, high temperature waxes, and various salts.

Figure 27:
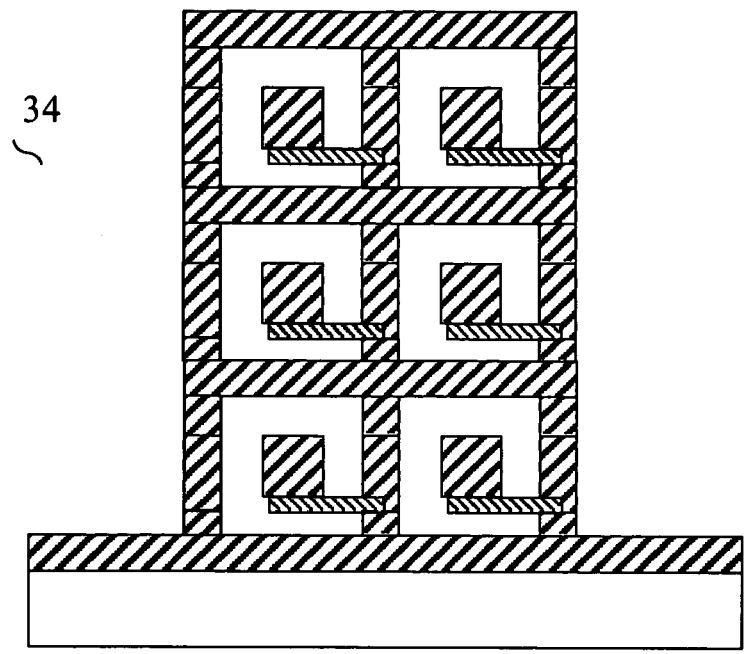
FIGS. 27 and 28, respectively, illustrate cross-sectional views of a plurality of the first and second exemplary coaxial waveguide microstructures in a stacked arrangement in accordance with the invention.
Figure 28:
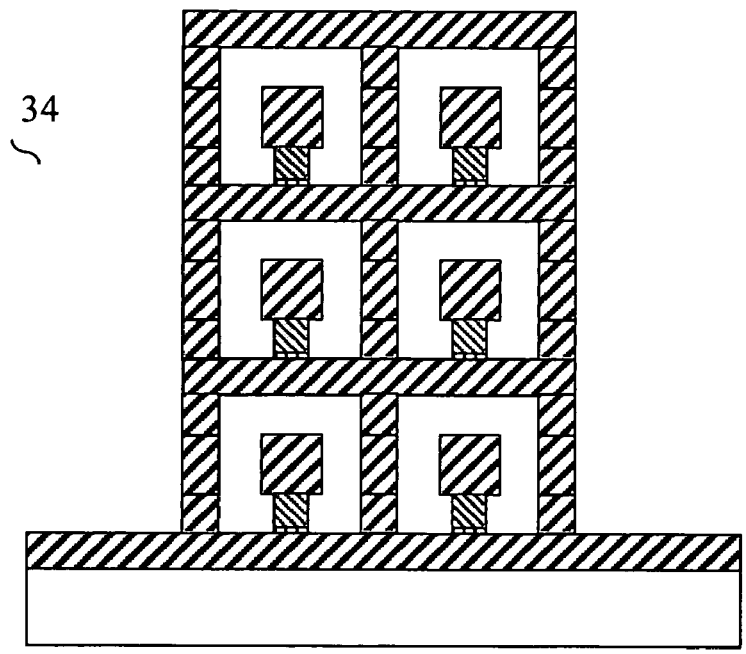

FIGS. 27 and 28, respectively, illustrate cross-sectional views of a plurality of the first and second exemplary coaxial waveguide microstructures in a stacked arrangement 34. The stacked arrangement can be achieved by continuation of the sequential build process through each stack, or by preforming the waveguides on individual substrates, separating waveguide structures from their respective substrates using a release layer, and stacking the structures. In theory, there is not a limit on the number of waveguides that can be stacked using the process steps discussed herein. In practice, however, the number of layers will be limited by the ability to manage the thicknesses and stresses and resist removal associated with each additional layer. The space utilization of the wave-guides can be very high since adjacent waveguides can share common sidewalls. While the waveguides illustrated are parallel, alternative designs can include, for example, any planar geometry, for example, those resulting in splitters, combiners, circulators, branching networks, and the like. Consequently, the waveguides can be angled with respect to each other and produce curvature in their plane to reduce losses.

Figure 29:
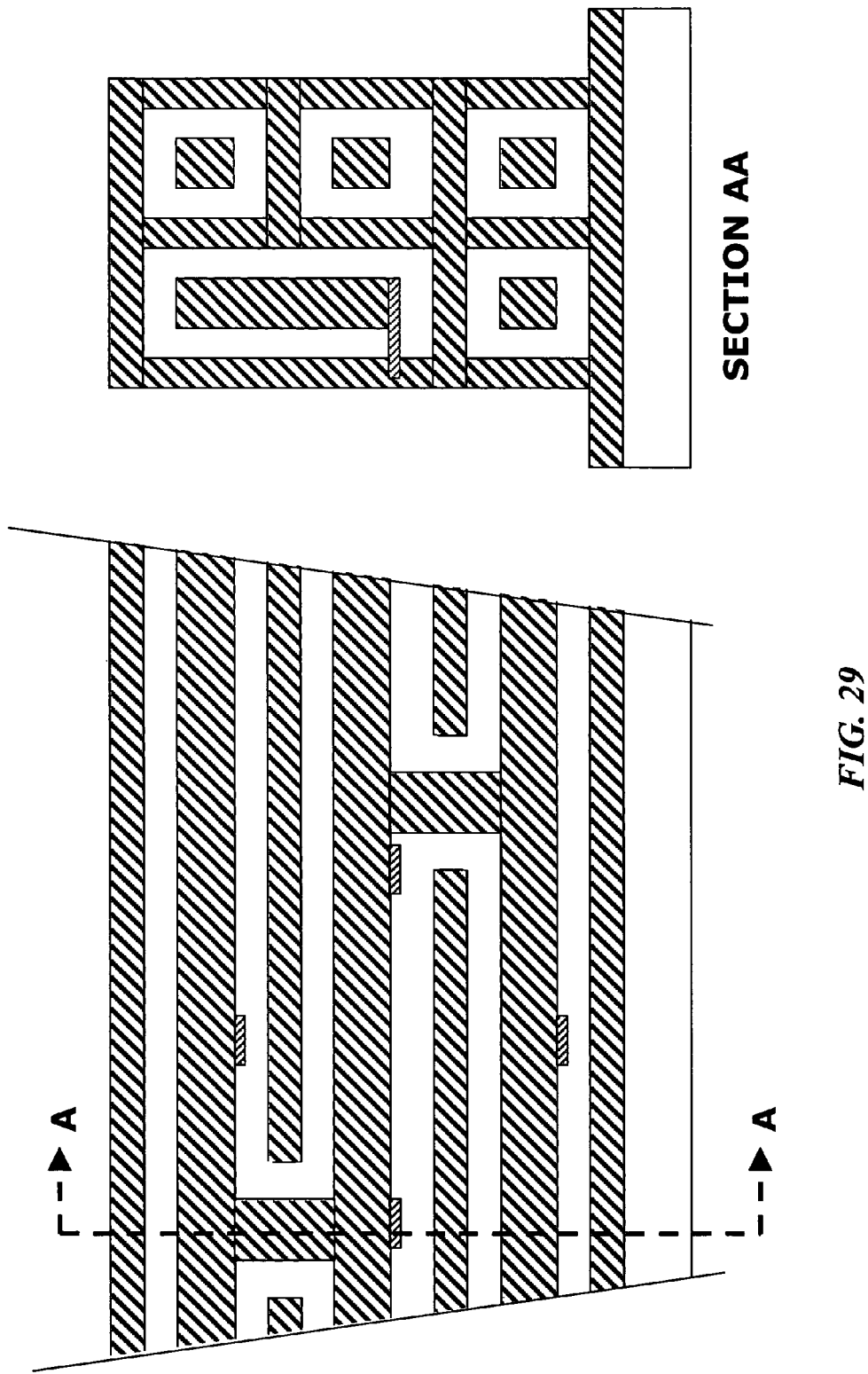
FIGS. 29–31 illustrate cross sectional views of exemplary coaxial waveguide microstructures in a stacked arrangement and connected by vias, in accordance with the invention.
Figure 30:
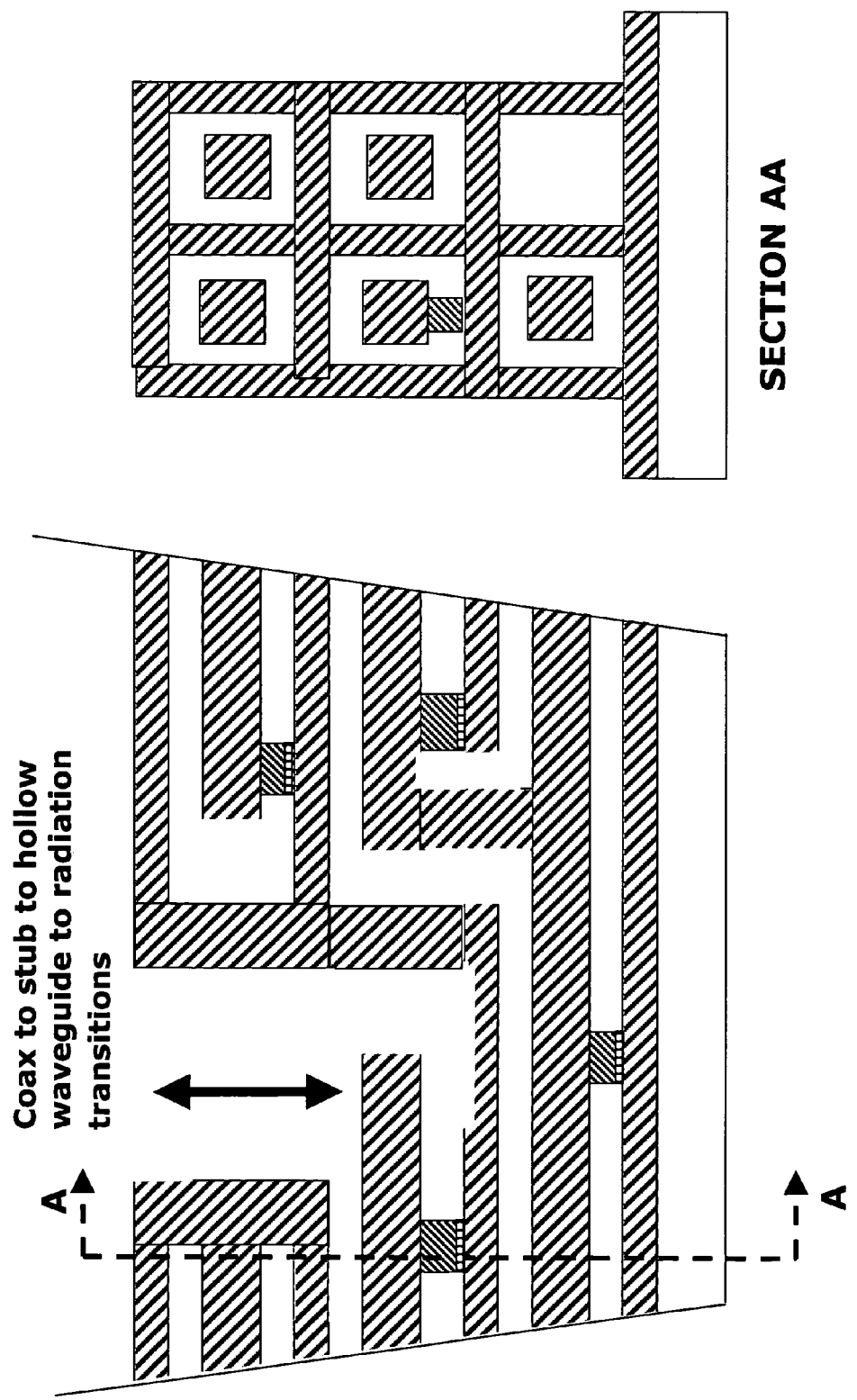
Figure 31:
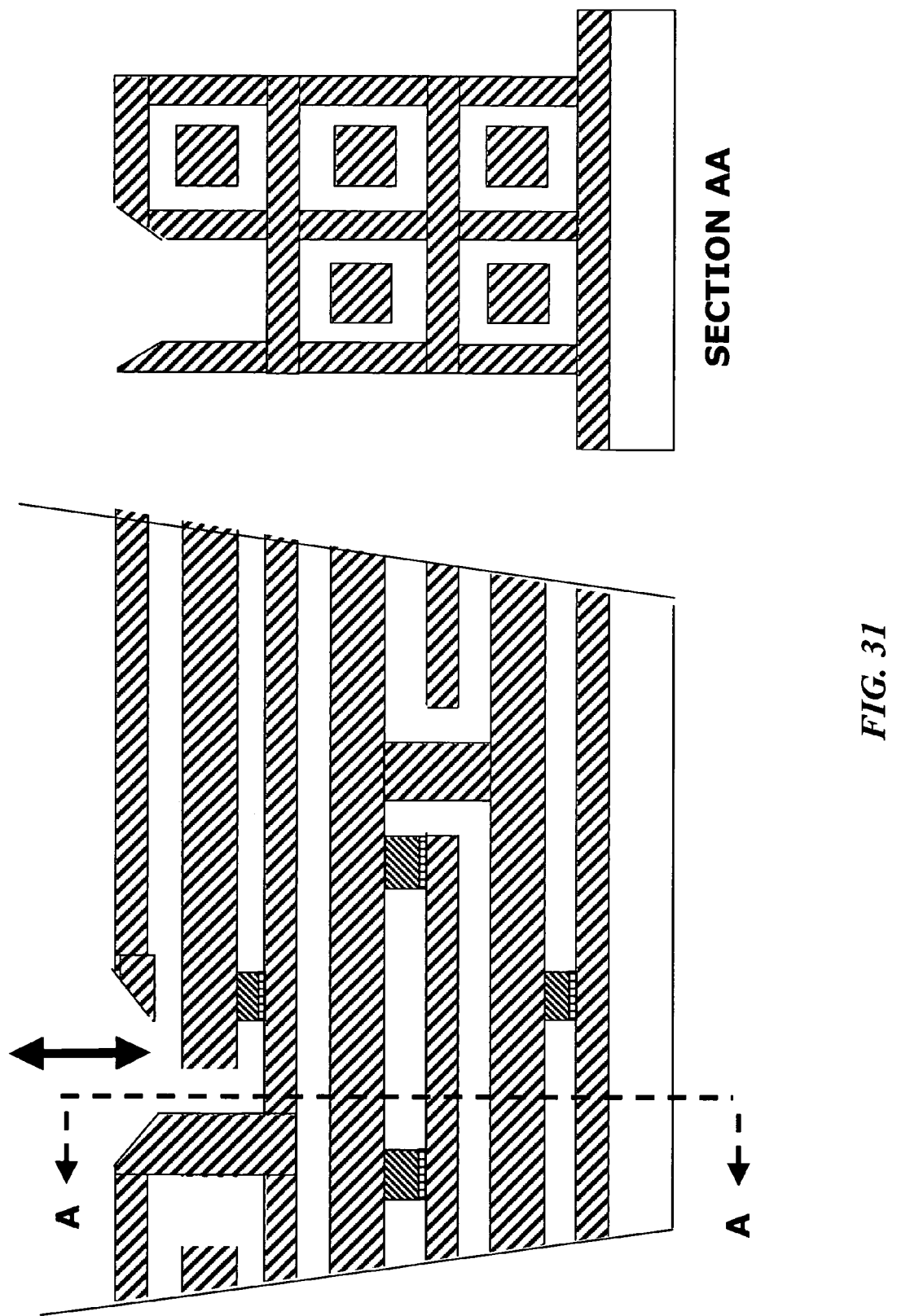

FIGS. 29–31 illustrate exemplary structures which allow waveguide cores on different levels to be joined together using vias. In these exemplary embodiments, a surface or part of a wall region of the outer conductor of various waveguides are patterned to expose an opening between two adjacent waveguides. The waveguide cores can be connected using vias created contemporaneously with the sidewalls and top surfaces. In these examples, the vias shown in section AA can be fabricated in three or more plating steps, excluding the waveguide core layers. Other methods of coupling between layers may be used, for example, by making multiple steps or stairs or making a coupler as described with reference to FIG. 32.

FIG. 30 illustrates a terminating stub creating a transition to a hollow waveguide that ends in an opening or aperture to free space or another device exterior to the waveguide network. Such a stub can be designed to allow efficient conversion, for example, between a square hollow waveguide and coaxial propagating modes. This structure forms the basis for creating an antenna or radiator.

FIG. 31 shows a tapered structure that can be made in one or more steps or by using grey scale resist processing or mechanical machining. Such tapered structures can be used to match impedances in a hollow waveguide, and also to concentrate an incoming signal or wave from free space to the stub.

In accordance with a further exemplary aspect of the invention, the structures may be comprised of layers of structural photosensitive dielectric polymers such as resists that are metallized on their surfaces. In this case, the thickness of the metallization can be determined by the skin depth requirements for the metals chosen at the frequencies of operation and may, for example be from about 0.2 to 3 $\mu m$ for typical applications. Additional thickness and other metallic structures such as posts may be included for other reasons such as piping heat from any integrated active devices.

The waveguides of the invention typically are square in cross-section. Other shapes, however, are envisioned. For example, other rectangular waveguides can be obtained in the same manner the square waveguides are formed, except making the width and height of the waveguides different. Rounded waveguides, for example, circular or partially rounded waveguides can be formed by use of gray-scale patterning. Such rounded waveguides can, for example, be created through conventional lithography for vertical transitions and might be used to more readily interface with external micro-coaxial conductors, to make connector interfaces, etc.

FIG. 32 illustrates two parallel waveguides cores 40, 42 which are brought into close proximity to each other for a short distance such that the common outer conductor sidewall 44 between them gradually but momentarily disappears over a predetermined distance and then reappears. This structure creates a gap 46 in the sidewall. Removal of the sidewall portion over the pre-determined distance allows for controlled coupling between the waveguides. Within gap 46, cross talk will occur between the RF signal on one core and the neighboring core. This geometry allows components such as RF splitters and attenuators to be created and is applicable to waveguides with and without center conductors. With such a structure, the desired amount of coupling can more accurately be controlled resulting in greater ease to achieve a desired split ratio. Well-defined splitters and couplers are highly desired to create sophisticated RF and microwave networks. More than one controlled perforation in the wall between the waveguides can optionally be used for the same purpose. Techniques such as offsetting the center conductor, changing the exterior waveguide dimensions in the region of the coupler, and other structural modifications may be utilized to optimize the desired effect.

For certain applications, it may be beneficial to include one or more coaxial-type and hollow-type waveguides on the same substrate. FIGS. 33A and 33B illustrate exemplary transition structures for connecting a coaxial waveguide 48 to a hollow transmission-type waveguide 50. Such transition can be accomplished through means known in the art such as creating a center conductor probe, wherein one or more of the coaxial-type waveguides terminates with short stubs into the hollow-type waveguide structures. These transitions can occur between and within the layers. The distance d between the walls and the stub as may be adjusted to maximize the efficiency of these radiators.

Figure 34:
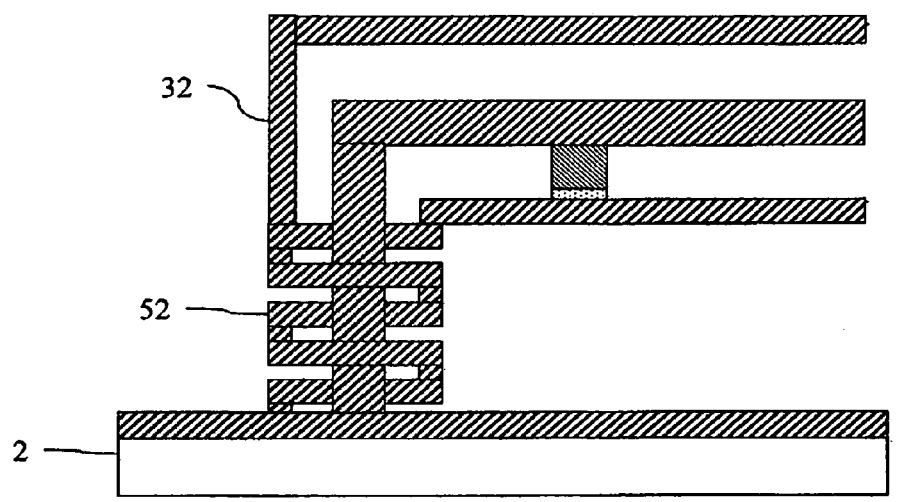
FIG. 34 illustrates an exemplary waveguide microstructure affixed to a substrate by a flexible structure, in accordance with the invention.

Depending on the specific materials used for the waveguide structure and the substrate to be coupled with the structure, it may be beneficial to provide a flexible or compliant interface between the two to compensate for coefficient of thermal expansion (CTE) mismatch. This can take the form, for example, of flexible fingers or posts perpendicular to the substrate or interface with narrow gaps between the fingers or posts allowing flexibility and compliance as needed. Other techniques include, for example, compliant and conductive bumps, springs, rings connected by posts, or flex circuitry. FIG. 34 illustrates a compliant interface in the form of a spring structure 52, connecting a waveguide 32 to a substrate 2.

Using such a technique, the first layer built on a substrate can be, for example, a series of center conductors surrounded by circular or rectangular springs spaced with less than one quarter wave between the rings and connected with one or more spaced posts between the rings. Also, rings may be made connected by short posts separated by a distance typically less than a quarter, for example, less than 1/10 of the wavelength at the highest frequency desired allowing spring like vertical connections for both compliance in connectors and to help deal with coefficient of thermal expansion (CTE) mismatch between these layers and other materials such as silicon and gallium arsenide.

Optionally, the walls of the waveguide can be formed such that they are not continuous. The walls can, for example, be made of interconnected vias, posts, spirals, or springs with the elements being spaced apart so as to minimize or prevent loss at the desired frequency. Typically, this distance is less than 1/4 of a wavelength at the desired frequency of operation, for example, less than 1/10 of such wavelength. Further optionally, a combination of the above together with continuous walls may be used. For example the top and bottom walls may be planar and the vertical surfaces composed of interconnecting vias. Such wall structures can optionally be utilized throughout the interconnect substrate. Additional benefits of non-continuous wall structures include one or more of: the ability to make compliant structures that can better deal with CTE mismatch of integrated die or substrates, better ability to remove the resist or obtain fluid flow in and from the substrate, better tuned operating characteristics, and compliance in interconnections and connectors.

Figure 35:
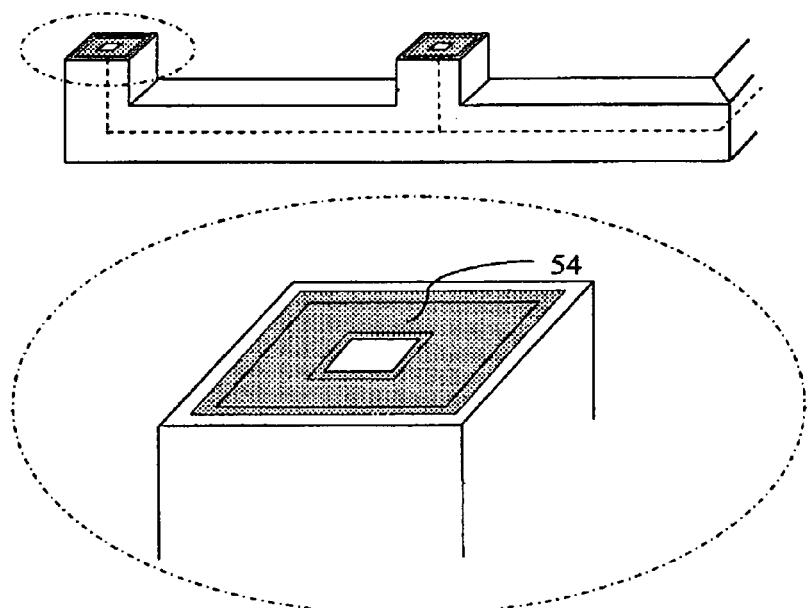
FIG. 35 illustrates an exemplary capped structure for preventing contamination of the coaxial waveguide microstructures, in accordance with the invention.

With reference to FIG. 35, a dielectric cap layer, or membrane, 54 can optionally be formed over the end faces of the waveguide microstructure to protect the waveguide from dust and other contamination or to serve as a dielectric platform on the top or bottom surfaces to hybridly mount devices. In the exemplified structure, the cap layer 54 covers the outer periphery of the center conductor end surface and the inner periphery of the outer conductor end surface, to allow electrical and thermal continuity, while also protecting the waveguide from contamination. The cap layer can be formed, for example, by depositing the material, for example, by spin-coating and patterning a photoimageable dielectric layer that remains. The material can be, for example, a photopatternable polymer that is relatively insoluble in the medium used to remove the resist from the final structure, for example, a photoresist. Vent holes (not shown) may be provided in the cap layer to prevent stress therein and to facilitate dissolution and removal of the resist in the core volume.

Figure 36:
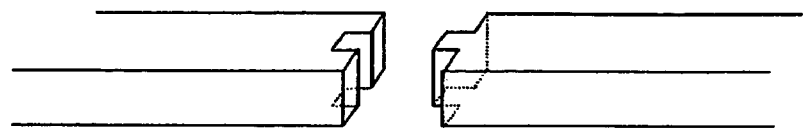
FIGS. 36–38 illustrate various exemplary structures for interconnecting waveguide microstructures, in accordance with the invention.
Figure 37:
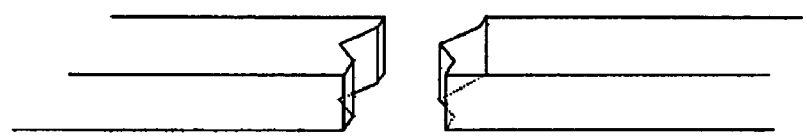
Figure 38:
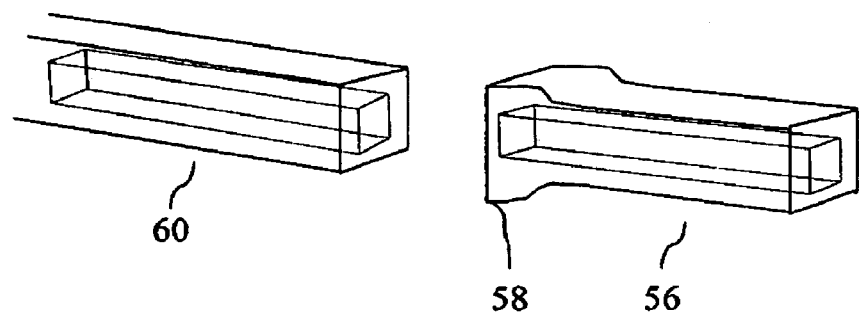

It may be desired to connect multiple waveguide structures together or to connect the waveguide structures to other structures, for example, when mating a wafer or device, for example, an RF device such as a microwave integrated circuit device, a microwave component, or other surface mount component, as a temporary connection when testing the waveguide structure, or when replacing parts. A number of interlocking geometries can be utilized to interconnect the waveguides with other waveguides or other components. For example, overlapping tubes, tubes and pins, slots and keys for the outer conductor and inner conductor, if present, may be used for this purpose. FIGS. 36–38 illustrate three exemplary interlocking connection structures. FIGS. 36–37 illustrate two slot/key connection structures. FIG. 38 shows an overlapping tube connection structure in which the waveguide 56 has a flared section 58 at an end portion thereof, such that that the flared section may be slid over an end portion of waveguide 60. The connection can be friction-fit, soldered and/or may be held in place with other adhesive material. These structures can be formed during fabrication of the waveguides using standard photolithography techniques.

Figure 39:
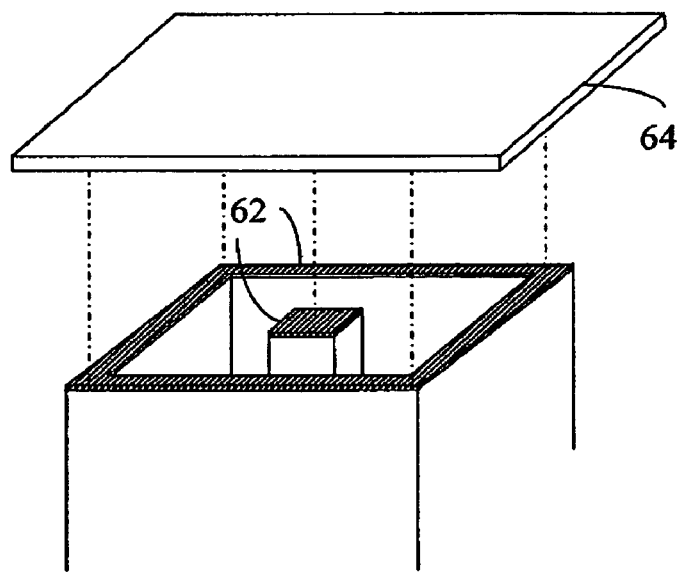
FIG. 39 illustrates an exemplary coaxial waveguide microstructure with solder affixed thereto, in accordance with the invention.

As shown in FIG. 39, a thin layer of solder 62 may be deposited by know means, for example, by electroplating or evaporation to facilitate bonding passive and/or active devices 64 to the waveguides, or for bonding the waveguide structure to a different substrate. The solder can be deposited on any vertical or horizontal exposed face and before or after removal of the photoresist from the waveguide core volume.

One may also desire to coat the interior walls of the waveguide outer conductor and/or the center conductor with a metal chosen for low loss at the frequencies used, such as gold, nickel, copper, nickel-iron, palladium, platinum, or gold or a combination of these metals, such as nickel and gold. This can be accomplished, for example, by a plating process after removal of the sacrificial resist from the waveguide structure.

Figure 25:
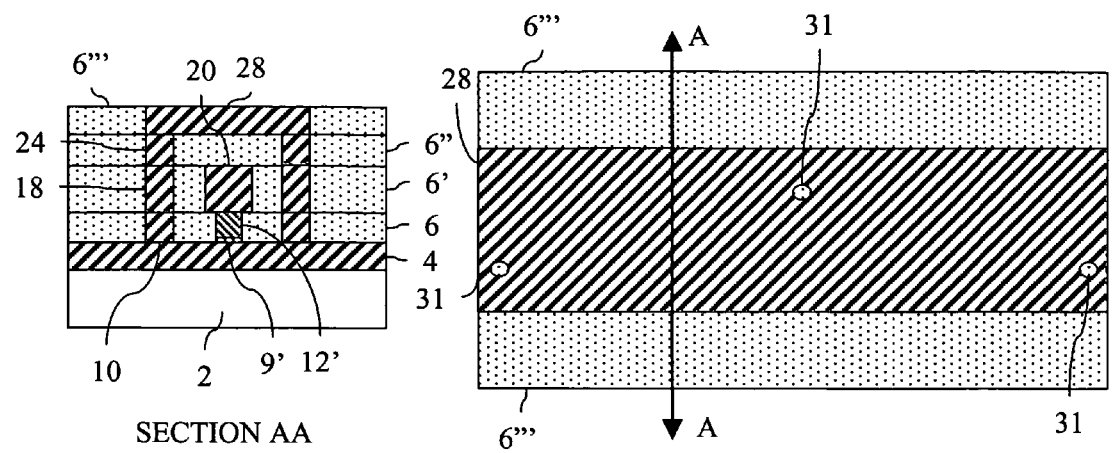
Figure 26:
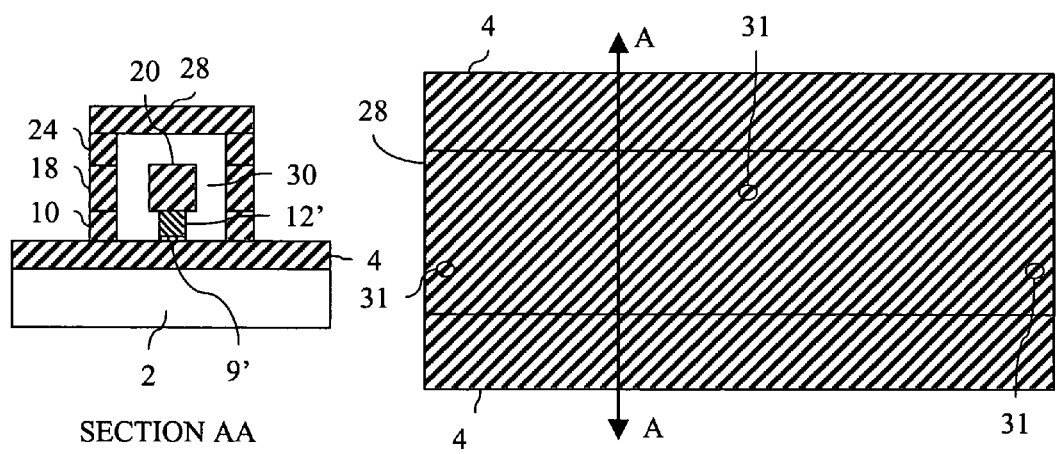

For certain applications, it may be desired to form electrical feedthroughs in the substrate or otherwise form holes or structures in the substrate that aid in transmission and reception of propagating waves, similar to the structure shown in FIG. 31. These features can be formed in the substrate, for example, by machining or other known patterning techniques. For example, it is envisioned that horn antennas can be made part of the substrate, for example, as shown in FIG. 25 by anisotropically etching a pit followed by metallization. The metallization step can optionally be conducted together with other steps in the sequential build process.

While the invention has been described in detail with reference to specific embodiments thereof, it will be apparent to one skilled in the art that various changes and modifications can be made, and equivalents employed, without departing from the scope of the claims.

What is claimed is:

1. A coaxial waveguide microstructure, comprising:
    a substrate having a planar region; and
    a coaxial waveguide disposed above the substrate, comprising:
        a center conductor;
        an outer conductor comprising one or more walls, spaced apart from and disposed around the center conductor, wherein each of the outer conductor walls is disposed over the planar region;

one or more dielectric support members for supporting the center conductor in contact with the center conductor and enclosed within the outer conductor; and a core volume between the center conductor and the outer conductor, wherein the core volume is under vacuum or in a gas state.

2. The coaxial waveguide microstructure of claim 1, wherein the outer conductor comprises a first sidewall, and a plurality of the dielectric support members have a first end portion embedded in the first sidewall and extend beneath the center conductor.

3. The coaxial waveguide microstructure of claim 1, comprising a plurality of the dielectric support members, wherein the coaxial waveguide has a generally rectangular coaxial structure.

4. The coaxial waveguide microstructure of claim 1, wherein the one or more dielectric support members are in the form of support posts having a first end on an inner surface of the outer conductor and a second end in contact with the center conductor.

5. The coaxial waveguide microstructure of claim 1, wherein the coaxial waveguide has a generally rectangular coaxial structure.

6. A coaxial waveguide microstructure, comprising:
a substrate; and
a plurality of coaxial waveguides disposed above the substrate in a stacked arrangement, each waveguide comprising:
a center conductor;
an outer conductor comprising one or more walls, spaced apart from and disposed around the center conductor;
one or more dielectric support members for supporting the center conductor in contact with the center conductor and enclosed within the outer conductor; and
a core volume between the center conductor and the outer conductor,
wherein the core volume is under vacuum or in a gas state.

7. The coaxial waveguide microstructure of claim 6, wherein the plurality of the coaxial waveguides are joined together by one or more vias.

8. A coaxial waveguide microstructure, comprising:
a substrate; and
a coaxial waveguide disposed above the substrate, comprising:
a center conductor;
an outer conductor comprising one or more walls, spaced apart from and disposed around the center conductor, the one or more walls comprising: a first sidewall and a second sidewall opposite the first sidewall;
a plurality of dielectric support members for supporting the center conductor in contact with the center conductor and enclosed within the outer conductor, wherein a plurality of the dielectric support members have a first end portion embedded in the first sidewall and extend beneath the center conductor and a second plurality of the dielectric support members have a first end portion embedded in the second sidewall and extend beneath the center conductor; and
a core volume between the center conductor and the outer conductor,
wherein the core volume is under vacuum or in a gas state.

9. A coaxial waveguide microstructure, comprising:
a substrate; and
a coaxial waveguide disposed above the substrate, comprising:
a center conductor;
an outer conductor comprising one or more walls; spaced apart from and disposed around the center conductor;
one or more dielectric support members for supporting the center conductor in contact with the center conductor and enclosed within the outer conductor; and
a core volume between the center conductor and the outer conductor,
wherein the core volume is under vacuum or in a gas state, and
wherein the inner conductor and the outer conductor are comprised of copper or a copper-alloy and comprise a gold and/or nickel coating.

10. A coaxial waveguide microstructure, comprising:
a substrate; and
a coaxial waveguide disposed above the substrate, comprising:
a center conductor;
an outer conductor comprising one or more walls, spaced apart from and disposed around the center conductor;
one or more dielectric support members for supporting the center conductor in contact with the center conductor and enclosed within the outer conductor; and
a core volume between the center conductor and the outer conductor,
wherein the core volume is under vacuum or in a gas state, and
a sacrificial release layer between the substrate and the waveguide.

11. A coaxial waveguide microstructure, comprising:
a substrate; and
a coaxial waveguide disposed above the substrate, comprising:
a center conductor;
an outer conductor comprising one or more walls, spaced apart from and disposed around the center conductor;
one or more dielectric support members for supporting the center conductor in contact with the center conductor and enclosed within the outer conductor; and
a core volume between the center conductor and the outer conductor,
wherein the core volume is under vacuum or in a gas state, and
a connectorization structure at an end portion of the waveguide.

12. The coaxial waveguide microstructure of claim 11, wherein the connectorization structure comprises a slot structure, a key structure or a flared structure.

13. A coaxial waveguide microstructure, comprising:
a substrate;
a coaxial waveguide disposed above the substrate, comprising:
a center conductor;
an outer conductor comprising one or more walls, spaced apart from and disposed around the center conductor;
one or more dielectric support members for supporting the center conductor in contact with the center conductor and enclosed within the outer conductor; and a core volume between the center conductor and the outer conductor,
wherein the core volume is under vacuum or in a gas state, and
compliant interface means between the substrate and waveguide to compensate for CTE mismatch therebetween.

14. A coaxial waveguide microstructure, comprising:
a substrate; and
a coaxial waveguide disposed above the substrate, comprising:
a center conductor;
an outer conductor comprising one or more walls, spaced apart from and disposed around the center conductor;
one or more dielectric support members for supporting the center conductor in contact with the center conductor and enclosed within the outer conductor;
a core volume between the center conductor and the outer conductor,
wherein the core volume is under vacuum or in a gas state, and
a dielectric membrane over an end face of the waveguide extending from the center conductor to the outer conductor.

15. A hermetic package, comprising a coaxial waveguide microstructure, comprising:
a substrate; and
a coaxial waveguide disposed above the substrate, comprising:
a center conductor;
an outer conductor comprising one or more walls, spaced apart from and disposed around the center conductor;
one or more dielectric support members for supporting the center conductor in contact with the center conductor and enclosed within the outer conductor; and
a core volume between the center conductor and the outer conductor,
wherein the core volume is under vacuum or in a gas state.

16. A method of forming a coaxial waveguide microstructure by a sequential build process, comprising:
(a) depositing a plurality of layers over a substrate having a planar region, wherein the layers comprise one or more of a metal material, a sacrificial photoresist material, and a dielectric material, thereby forming a structure above the substrate, comprising:
a center conductor;
an outer conductor comprising one or more walls, spaced apart from and disposed around the center conductor, wherein each of the outer conductor walls is disposed over the planar region;
one or more dielectric support members for supporting the center conductor, in contact with the center conductor and enclosed within the outer conductor; and
a core volume between the center conductor and the outer conductor, wherein the core volume comprises sacrificial photoresist; and
(b) removing the sacrificial photoresist from the core volume.

17. The method of claim 16, further comprising planarizing one or more of the layers of (a) by chemical mechanical planarization, lapping or a combination thereof.

18. The method of claim 16, wherein the outer conductor comprises a first sidewall, and a plurality of the dielectric support members have a first end portion embedded in the first sidewall and extend beneath the center conductor.

19. A method of forming a coaxial waveguide microstructure by a sequential build process, comprising:
(a) depositing a plurality of layers over a substrate, wherein the layers comprise one or more of a metal material, a sacrificial photoresist material, and a dielectric material, thereby forming a structure above the substrate, comprising:
a center conductor;
an outer conductor comprising one or more walls, spaced apart from and disposed around the center conductor;
one or more dielectric support members for supporting the center conductor, in contact with the center conductor and enclosed within the outer conductor;
a core volume between the center conductor and the outer conductor, wherein the care volume comprises sacrificial photoresist; and
(b) removing the sacrificial photoresist from the core volume; and after (b),
(c) evacuating the core volume to a vacuous state.

20. A method of forming a coaxial waveguide microstructure by a sequential build process, comprising:
(a) depositing a plurality of layers over a substrate, wherein the layers comprise one or more of a metal material, a sacrificial photoresist material, and a dielectric material, thereby forming a structure above the substrate, comprising:
a center conductor;
an outer conductor comprising one or more walls, spaced apart from and disposed around the center conductor;
one or more dielectric support members for supporting the center conductor, in contact with the center conductor and enclosed within the outer conductor;
a core volume between the center conductor and the outer conductor, wherein the core volume comprises sacrificial photoresist; and
(b) removing the sacrificial photoresist from the core volume; and after (b),
(c) separating the substrate from the structure.

21. A method of forming a coaxial waveguide microstructure by a sequential build process, comprising:
(a) depositing a plurality of layers over a substrate, wherein the layers comprise one or more of a metal material, a sacrificial photoresist material, and a dielectric material, thereby forming a structure above the substrate, comprising:
a center conductor;
an outer conductor comprising one or more walls, spaced apart from and disposed around the center conductor;
one or more dielectric support members for supporting the center conductor, in contact with the center conductor and enclosed within the outer conductor; and
a core volume between the center conductor and the outer conductor, wherein the core volume comprises sacrificial photoresist;
(b) removing the sacrificial photoresist from the core volume; and
(c) planarizing one or more of the layers of (a) by chemical mechanical planarization.

22. A coaxial waveguide microstructure, comprising:
a substrate; and
a coaxial waveguide disposed above the substrate, comprising:
   a center conductor;
   an outer conductor comprising one or more walls, spaced apart from and disposed around the center conductor;
   one or more dielectric support members for supporting the center conductor in contact with the center conductor and enclosed within the outer conductor; and
   a core volume between the center conductor and the outer conductor,
      wherein the core volume is under vacuum or in a gas state, and
      wherein the coaxial waveguide has a generally rectangular coaxial structure.

23. The coaxial waveguide microstructure of claim 22, comprising a plurality of the dielectric support members.

24. The coaxial waveguide microstructure of claim 23, wherein the center conductor and outer conductor comprise copper or a copper alloy.

25. The coaxial waveguide microstructure of claim 22, further comprising an active device.

26. The coaxial waveguide microstructure of claim 22, wherein the active device is bonded to the coaxial waveguide.

* * * * *